US007309994B2

(12) United States Patent
Ehlers et al.

(10) Patent No.: US 7,309,994 B2
(45) Date of Patent: Dec. 18, 2007

(54) INTEGRATED DIRECTIONAL BRIDGE

(75) Inventors: Eric R. Ehlers, Santa Rosa, CA (US); Craig Hutchinson, Windsor, CA (US); Richard L. Rhymes, Santa Rosa, CA (US); Timothy E. Shirley, Santa Rosa, CA (US); Bobby Y. Wong, Stockton, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 149 days.

(21) Appl. No.: 11/071,670

(22) Filed: Mar. 1, 2005

(65) Prior Publication Data

US 2006/0197626 A1 Sep. 7, 2006

(51) Int. Cl.
*G01R 27/02* (2006.01)
*H01P 5/18* (2006.01)

(52) U.S. Cl. ..................... 324/610; 324/647; 324/648; 333/109; 333/112

(58) Field of Classification Search ............... 324/610, 324/647, 648; 333/109, 112
See application file for complete search history.

(56) References Cited

U.S. PATENT DOCUMENTS 3,683,274 A * 8/1972 Martin ..................... 324/646
4,013,949 A * 3/1977 Ice ........................... 324/646
4,982,164 A * 1/1991 Schiek et al. .............. 324/638
5,121,067 A * 6/1992 Marsland ................... 324/637
6,580,278 B1 * 6/2003 Harrison .................... 324/646

* cited by examiner

*Primary Examiner*—Walter Benson
*Assistant Examiner*—John Zhu

(57) ABSTRACT

A directional bridge for measuring propagated signals to and from a source device to a load device where both the source device and load device are in signal communication with the directional bridge is disclosed. The directional bridge may include a first bridge circuit network and a first sensing element in signal communication with the first bridge circuit network. The first sensing element may produce a first measured signal that is proportional to the propagated signals.

35 Claims, 25 Drawing Sheets

INTEGRATED DIRECTIONAL BRIDGE

BACKGROUND OF THE INVENTION

With the advent of electronic equipment, radio frequency ("RF"), microwave, and millimeter wave circuits are common. As telecommunication systems continue to advance, there is a constant need to increase the bandwidth, speed, efficiency, and miniaturization of new telecommunication devices while constantly increasing the quality of the telecommunication devices and reducing the manufacturing costs.

Typically, telecommunication devices, and electronic equipment in general, include numerous types of electronic components and circuits including directional couplers and directional bridges. Generally, directional couplers and directional bridges are electronic devices utilized in RF, microwave, and millimeter wave signal routing for isolating, separating or combining signals. Typically, directional couplers are utilized as impedance bridges for microwave and millimeter wave measurements and for power monitoring.

Directional couplers and directional bridges (generally known as "directional circuits") are usually three-port or four-port devices/circuits that have a signal input port (from a source) and a signal output port (to a load) and at least one coupled port whose output is proportional to either the incident wave (from the source) or the reflected wave (from the load). It is appreciated by those skilled in the art that it is common practice in RF, microwave, and millimeter wave engineering to consider an electrical signal in an electronic circuit/device as the sum of an incident and a reflected traveling wave to and from a source and load, respectively, relative to a characteristic impedance $Z_0$ of the electronic circuit/device (typically about 50 ohms). A directional circuit generally separates a transmitted signal into the detection circuit or coupled port based on the direction of the signal propagation. There are many uses for these directional circuits including network analysis and monitoring the output signal levels of a traveling wave incident on a load.

At present, there are numerous approaches to implementing a directional circuit. One example is to implement a directional coupler as a device that has a physical length over which two transmission lines couple together electromagnetically or that utilizes the phase shift along a length of transmission line. Another example approach (known as a directional bridge) may utilize lumped elements that may include transformers and resistors.

In FIGS. 1 and 2, an example of an implementation of known directional couplers 100 is shown. The directional coupler 100 may include three ports such as a signal input port ("port A 102"), a signal output port ("port B 104"), and at least one coupled port ("port C 106"). The directional coupler 100 may be in signal communication with a signal source 108 via signal source impedance ("$Z_{source}$") 110, and a load having a load impedance ("$Z_{load}$") 112. As an example of operation, the directional coupler 100 may be utilized to unequally split the signal 114 flowing in from the load at port B 104 while simultaneously fully passing the signal 116 flowing in from the opposite direction from the source 108 into port A 102. Ideally the signal 114 flowing in from the load at port B 104 will pass to the coupled port C 106 and appear as coupled signal 118. Similarly, an input signal 120 at port C 106 would pass to port B 104. However, port A 102 and port C 106 are isolated in that any signal 116 flowing into port A 102 will not appear at port C 106 but will propagate through to port B 104. Additionally, port B 104 is isolated from port A 102 because any signal 114 from port B 104 will flow to port C 106 not port A 102. In FIG. 2, an example of an implementation of the known directional coupler 100 is shown utilizing two transformers T1 and T2 and a resistor R.

Unfortunately, directional couplers have the disadvantage that they are typically too large to be practical for an integrated circuit ("IC") except at very high frequencies because at low frequencies approaching direct current ("DC") they are typically too large to be practical for many electronic instruments. As an example, directional couplers are usually limited by size limitations to low frequency operation of about 10 megahertz ("MHz") in most electronic devices.

Attempts to solve this problem include utilizing directional bridges because directional bridges typically operate at lower frequencies than directional couplers. However, while directional bridge may typically operate in the kilohertz ("KHz") frequency range, they still unfortunately do not operate at low frequencies approaching DC. Additionally, similar to known directional couplers, known directional bridges are not suitable for integration on ICs because directional bridges generally utilize transformers which are difficult to implement with known IC technologies particularly at low frequencies. Moreover, typically broadband instrument grade directional couplers and conventional directional bridges are implemented with expensive precision mechanical parts and assemblies and typically require hand assembly and adjustment.

Therefore, there is a need for a new direction circuit/device capable of operating continuously from DC up to high frequencies in the millimeter wave range while being simple to integrate with known IC technologies.

SUMMARY

A directional bridge for measuring propagated signals to and from a source device to a load device where both the source device and load device are in signal communication with the directional bridge is disclosed. The directional bridge may include a first bridge circuit network and a first sensing element in signal communication with the first bridge circuit network. The first sensing element may produce a first measured signal that is proportional to the propagated signals.

In an example of an implementation of the directional bridge, the first bridge circuit network may include a first impedance element in signal communication with the source device at a first node and the first sensing element at a second node and a second impedance element in signal communication with the source device and first impedance element at the first node and in signal communication with the first sensing element at a third node. Additionally, the first bridge circuit network may further include a third impedance element in signal communication with the second impedance element and the first sensing element at the third node. In this example, the first measured signal may be produced by the first sensing element in response to detecting a difference in voltage between a first voltage at the third node and a second voltage at the second node.

The directional bridge may further include a second bridge circuit network and a second sensing element in signal communication with the second bridge circuit network, wherein the second sensing element may produce a second measured signal that is proportional to the propagated signals. The second bridge circuit network may include a fourth impedance element in signal communication with the source device, the first impedance element, and the second impedance element at the first node and in signal communication with the second sensing element at a fourth node, and a fifth impedance element in signal communication with both the fourth impedance element and the second sensing element at the fourth node. The second measured signal may be produced by the second sensing element in response to detecting a difference in voltage between a third voltage at the fourth node and a second voltage at the second node.

Alternatively, the directional bridge may further include a fourth impedance element in signal communication with both the first impedance element and the first sensing element at the second node and in signal communication with the load device at a fourth node and a fifth impedance element in signal communication with both the fourth impedance element and the load device at the fourth node. Additionally, the directional bridge may include a sixth impedance element in signal communication with the fifth impedance element at a fifth node and a second sensing element in signal communication with the first sensing element, first impedance element, and fourth impedance element at the second node and in signal communication with both the fifth impedance element and sixth impedance element at the fifth node, wherein the second sensing element produces a second measured signal that is proportional to the propagated signals. In this example, the second measured signal may be produced by the second sensing element in response to detecting a difference in voltage between the second voltage at the second node and a third voltage at the fifth node.

In another example of an implementation of the directional bridge, the first bridge circuit network may include a first impedance element in signal communication with both the source device and the first sensing element at a first node and a second impedance element in signal communication with the first impedance element at a second node and in signal communication with the first sensing element at a third node. Additionally, the first bridge circuit network may include a third impedance element in signal communication with both the second impedance element and the first sensing element at the third node. The first measured signal may be produced by the first sensing element in response to detecting a difference in voltage between a first voltage at the first node and a second voltage at the third node.

The directional bridge may further include a second bridge circuit network and a second sensing element in signal communication with the second bridge circuit network and both first impedance element and first sensing element at the first node, wherein the second sensing element produces a second measured signal that is proportional to the propagated signals. The second bridge circuit network may include a fourth impedance element in signal communication with both the first impedance element and the second impedance element at the second node and in signal communication with the second sensing element at a fourth node and a fifth impedance element in signal communication with both the fourth impedance element and the second sensing element at the fourth node. The second measured signal may be produced by the second sensing element in response to detecting a difference in voltage between the first voltage at the first node and a third voltage at the fourth node.

Alternatively, the directional bridge may further include a second bridge circuit network and a second sensing element in signal communication with the second bridge circuit network and both first impedance element and second impedance element at the second node, wherein the second sensing element produces a second measured signal that is proportional to the propagated signals. The second bridge circuit network may include a fourth impedance element in signal communication with both the first impedance element and the first sensing element at the first node and in signal communication with the second sensing element at a fourth node and a fifth impedance element in signal communication with both the fourth impedance element and the second sensing element at the fourth node. The second measured signal may be produced by the second sensing element in response to detecting a difference in voltage between a third voltage at the fourth node and a fourth voltage at the second node.

Alternatively, the directional bridge may further include a fourth impedance element in signal communication with both the first impedance element and the second impedance element at the second node and in signal communication and a second sensing element in signal communication with the first sensing element, second impedance element, and third impedance element at the third node and in signal communication with the fourth impedance element at a fourth node, wherein the second sensing element produces a second measured signal that is proportional to the propagated signals. The second measured signal may be produced by the second sensing element in response to detecting a difference in voltage between the second voltage at the third node and a third voltage at the fourth node.

In another example of an implementation of the directional bridge, the first bridge circuit network may include: a first impedance element in signal communication with the source device at a first node; a second impedance element in signal communication with the source device and first impedance element at the first node and in signal communication with the first sensing element at a second node; a third impedance element in signal communication with the second impedance element and the first sensing element at the second node; a fourth impedance element in signal communication with the first impedance element at a third node and with the first sensing element at a fourth node; and a fifth impedance element in signal communication with the fourth impedance element and the first sensing element at the fourth node. The first measured signal may be produced by the first sensing element in response to detecting a difference in voltage between a first voltage at the second node and a second voltage at the fourth node.

The directional bridge may further include a second bridge circuit network and a second sensing element in signal communication with the second bridge circuit network, wherein the second sensing element produces a second measured signal that is proportional to the propagated signals. The second bridge circuit network may include: a sixth impedance element in signal communication with both the first impedance element and the second impedance element at the first node and in signal communication with the second sensing element at a fifth node; a seventh impedance element in signal communication with both the sixth impedance element and the second sensing element at the fifth node; an eighth impedance element in signal communication with both the first impedance element and the fourth impedance element at the third node and in signal communication with the second sensing element at a sixth node; and a ninth impedance element in signal communication with the eighth impedance element at the sixth node. The second measured signal may be produced by the second sensing element in response to detecting a difference in voltage between a third voltage at the fifth node and a fourth voltage at the sixth node.

Alternatively, the directional bridge may further include: a sixth impedance element in signal communication with both the first impedance element and the fourth impedance element at the third node; a seventh impedance element in signal communication with the sixth impedance element at a fifth node; an eighth impedance element in signal communication with the seventh impedance element at a sixth node; and a second sensing element in signal communication with the first sensing element, fourth impedance element, and fifth impedance element at the fourth node and in signal communication with both the seventh impedance element and eighth impedance element at the sixth node, wherein the second sensing element produces a second measured signal that is proportional to the propagated signals. The second measured signal may be produced by the second sensing element in response to detecting a difference in voltage between the second voltage at the fourth node and a third voltage at the sixth node.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of the preferred embodiment, reference is made to the accompanying drawings that form a part hereof, and which show, by way of illustration, a specific embodiment in which the invention may be practiced. Other embodiments may be utilized and structural changes may be made without departing from the scope of the present invention.

In general, the invention is an integrated directional bridge that includes a plurality of two-terminal impedance elements connected in a bridge topology (i.e., also known a bridge circuit, a bridge circuit network, or bridge network) with a sensing element that is configured to respond to a voltage difference between two nodes of the bridge network. It is appreciated by those skilled in the art that numerous types of bridge topologies may be utilized. Examples of the sensing element may include passive transformer, passive diode, power sensing device, a direct current coupled ("DC-coupled") differential amplifier with a high common mode rejection ratio, a differential amplifier that is not DC coupled, a Gilbert Cell mixer with differential radio frequency ("RF") input, other mixers or samplers with differential RF inputs, or an integrated transformer or balun. For an integrated directional bridge operation that operates at DC, the sensing element operates at DC and is DC coupled. If phase information is not desired, a power sensing device such as a detector diode may be utilized as the sensing element.

Figure 1:
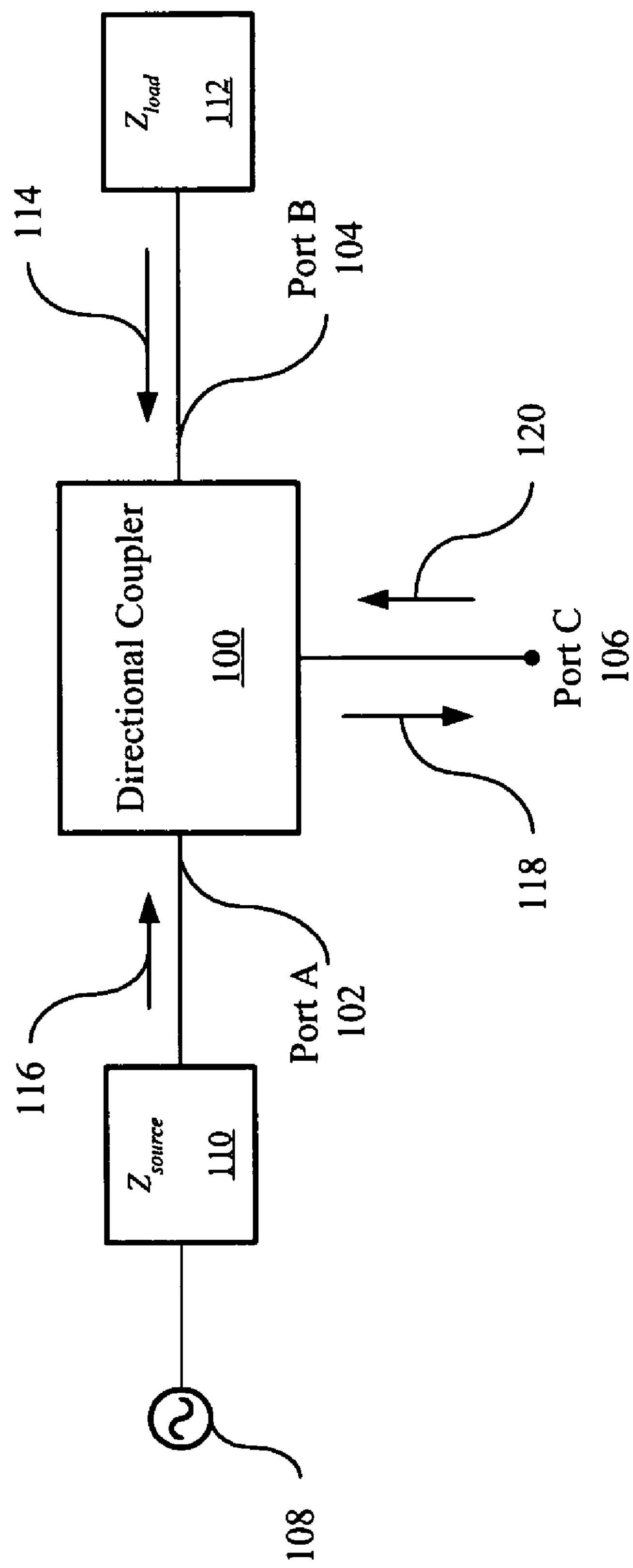
FIG. 1 is a block diagram of an example of an implementation of a known directional coupler.
Figure 2:
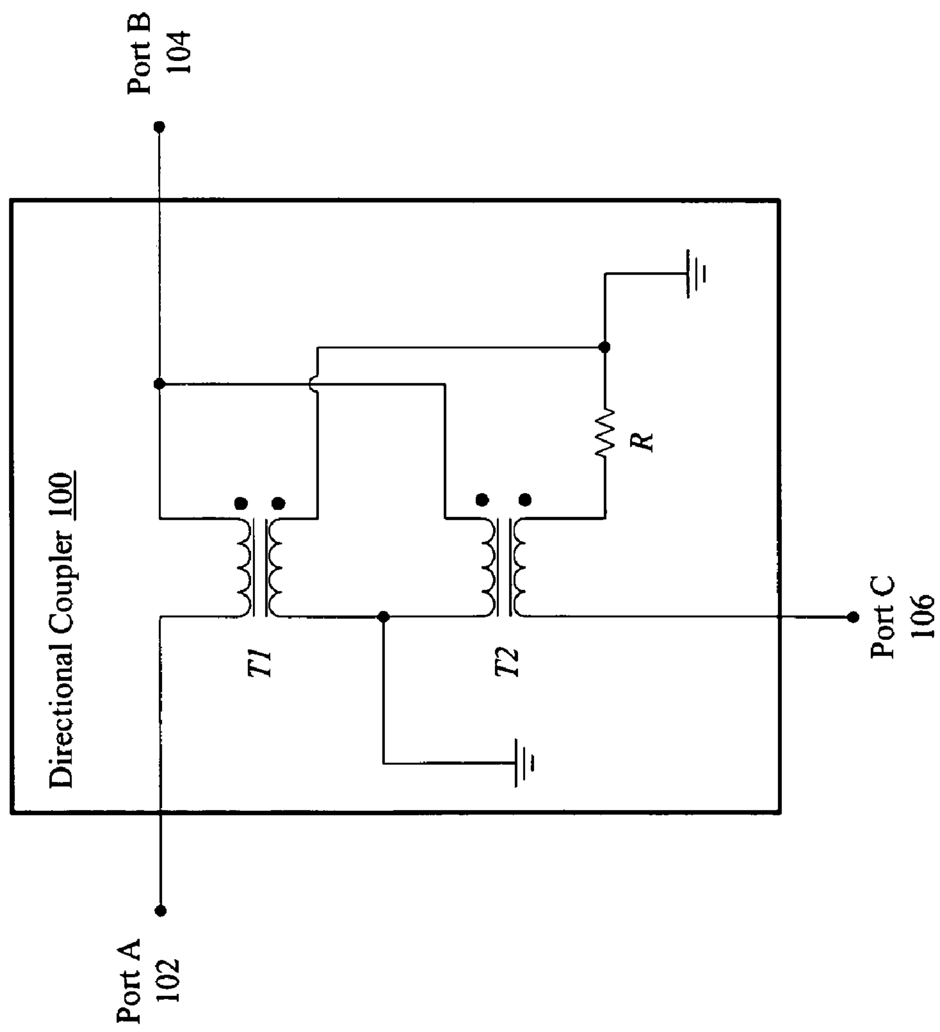
FIG. 2 is a block diagram of another example of an implementation of a known directional coupler.
Figure 3:
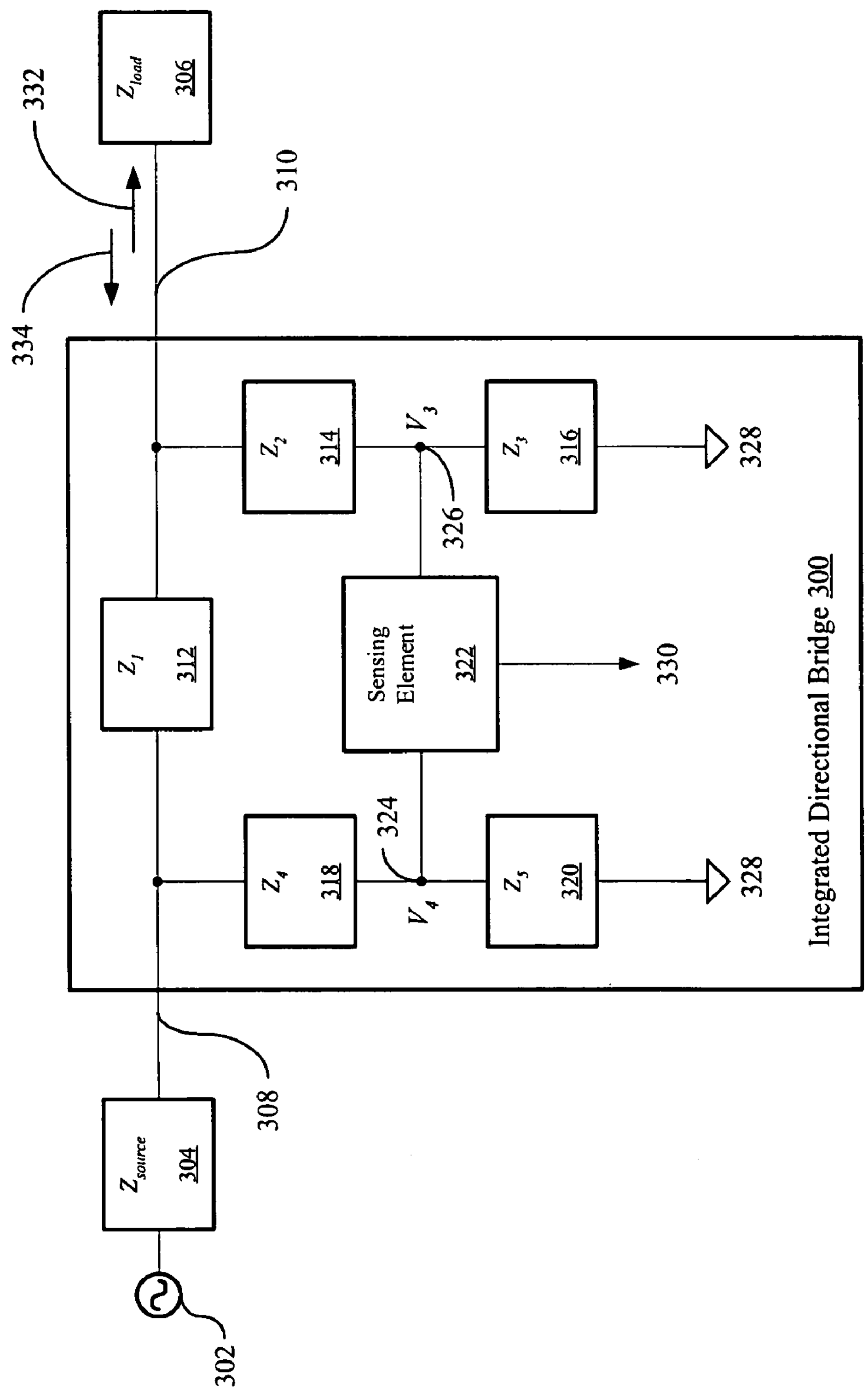
FIG. 3 is a block diagram of an example of an implementation of an integrated directional bridge utilizing a single-directional bridge topology.

In FIG. 3, a block diagram of an example of an implementation of an integrated directional bridge 300 utilizing a single-directional bridge topology is shown. The integrated directional bridge 300 may be in signal communication with a signal source 302 having a signal source impedance ("$Z_{source}$") 304 and a load having a load impedance ("$Z_{load}$") 306 via signal paths 308 and 310, respectively. The integrated directional bridge 300 may include impedance elements $Z_1$ 312, $Z_2$ 314, $Z_3$ 316, $Z_4$ 318, and $Z_5$ 320, and sensing element 322. In the example single-directional bridge topology, the signal source impedance $Z_{source}$ 304 is in signal communication with both impedance elements $Z_1$ 312 and $Z_4$ 318. The load impedance $Z_{load}$ 306 is in signal communication with both impedance elements $Z_1$ 312 and $Z_2$ 314. The sensing element 322 is in signal communication with both $Z_4$ 318 and $Z_5$ 320 at node 324 having a node voltage $V_4$. Similarly, the sensing element 322 is also in signal communication with both $Z_2$ 314 and $Z_3$ 316 at node 326 having a node voltage $V_3$. Both $Z_5$ 320 and $Z_3$ 316 are in signal communication with a common ground 328.

The impedance elements $Z_1$ 312, $Z_2$ 314, $Z_3$ 316, $Z_4$ 318, and $Z_5$ 320 may be either reactive impedance elements, real impedance elements (i.e., resistive elements), or combinations of real and reactive elements based on the frequency range of operation of the integrated directional bridge 300. The sensing element 322 (which may be a DC-coupled differential amplifier with a high common mode rejection ratio, or a Gilbert Cell mixer with differential RF input) senses the difference in voltage between node voltages $V_3$ and $V_4$ and produces a difference signal 330 of the voltage difference between node voltages $V_3$ and $V_4$ in both magnitude and phase.

As an example of operation, it is appreciated by those skilled in the art that the amplified difference signal 330 may be proportional to either the incident voltage signal ("$V_{incident}$") 332 from the integrated directional bridge 300 to $Z_{load}$ 306 or the reflected voltage ("$V_{reflected}$") 334 from $Z_{load}$ 306 to the integrated directional bridge 300. It is also appreciated that a passive load $Z_{load}$ 306 produces $V_{reflected}$ 334 by reflecting $V_{incident}$ 332. Additionally, it is appreciated that $V_{reflected}$ 334 may be generated by $Z_{load}$, if $Z_{load}$ is an active device.

If the sensing element 322 is a differential amplifier such as an operation amplifier connected between the nodes 324 and 326, the proportional factor ("k") is equal to the amplifier gain of the differential amplifier multiplied by the coupling factor of the directional bridge. It is appreciated that based on the values of the impedance elements $Z_1$ 312, $Z_2$ 314, $Z_3$ 316, $Z_4$ 318, and $Z_5$ 320, the integrated directional bridge 300 may be configured to either produce an amplified difference signal 330 that is either proportional to $V_{incident}$ 332 as shown in FIG. 4 or $V_{reflected}$ 334 as shown in FIG. 5.

Figure 4:
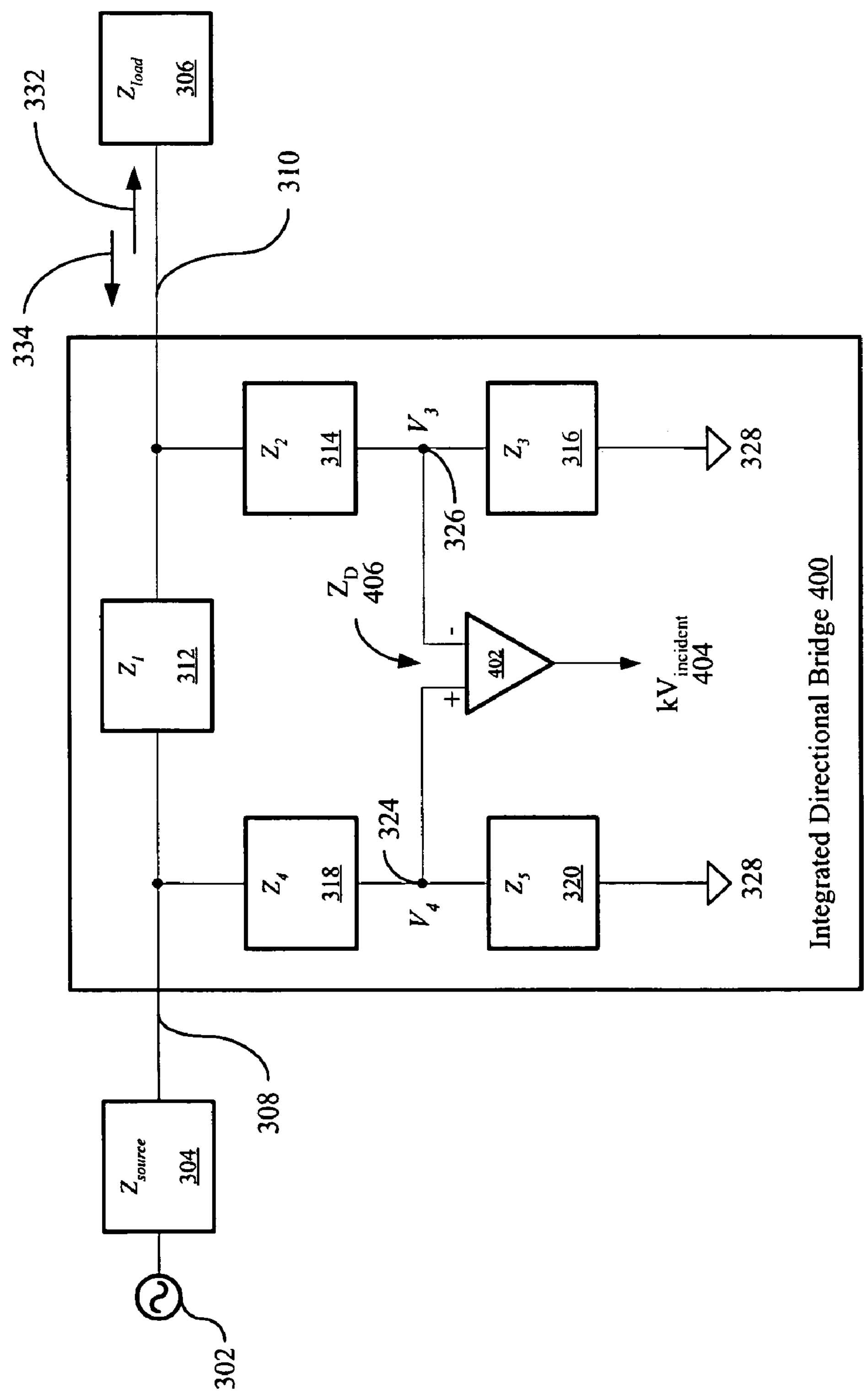
FIG. 4 is a block diagram of an example of an implementation of an integrated directional bridge utilizing a single-directional bridge topology with a differential amplifier that produces an amplified difference signal that is proportional to $V_{incident}$.
Figure 5:
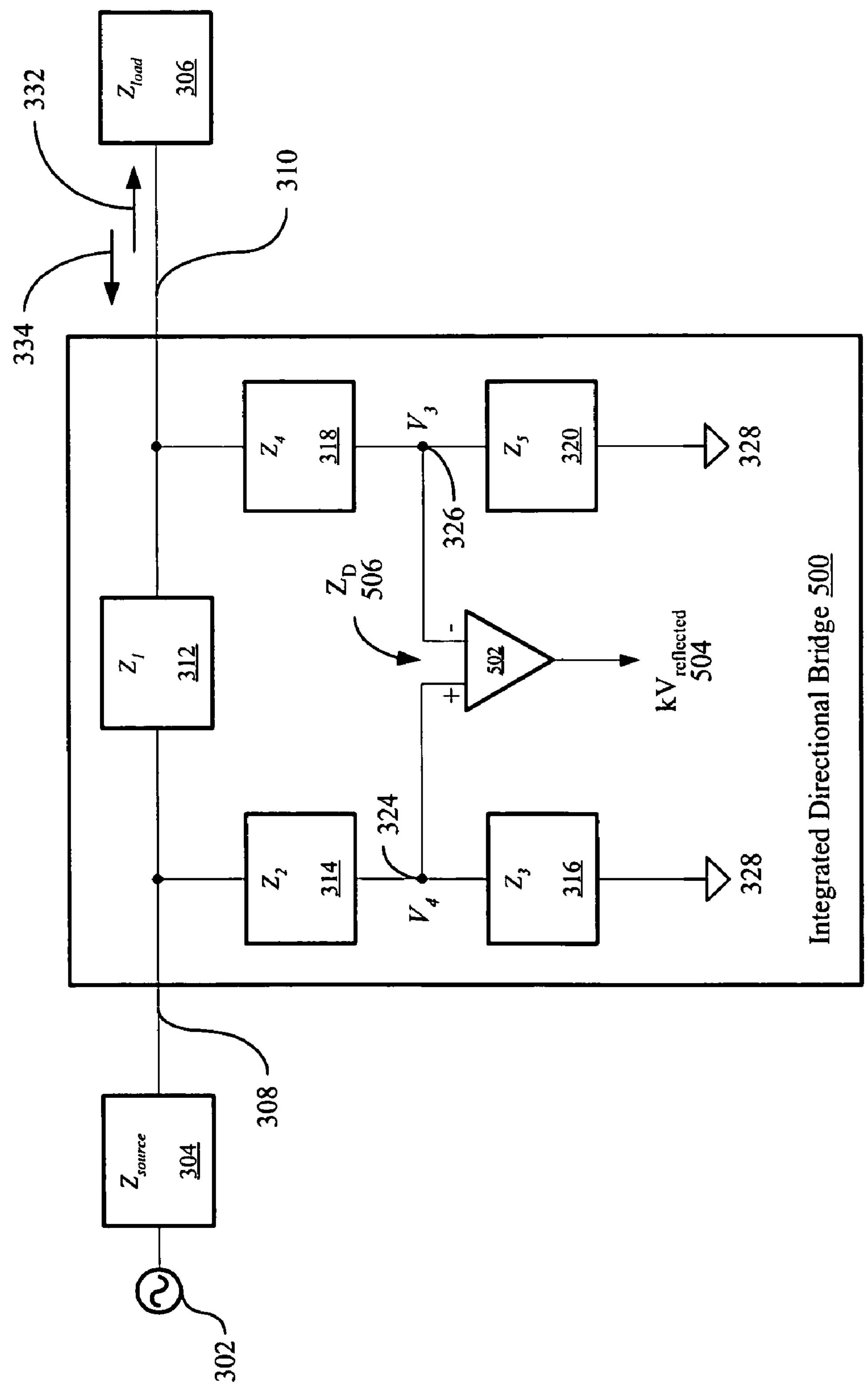
FIG. 5 is a block diagram of an example of an implementation of an integrated directional bridge utilizing a single-directional bridge topology with a differential amplifier that produces an amplified difference signal that is proportional to $V_{reflected}$.

In FIG. 4, a block diagram of an example of an implementation of an integrated directional bridge 400 utilizing a single-directional bridge topology with a differential amplifier 402 that produces an amplified difference signal 404 that is proportional to $V_{incident}$ 332 is shown. In this example, the sensing element 322 of FIG. 3 is a differential amplifier 402 and the integrated directional bridge 400 is configured to produce the amplified difference signal 404 that is proportional to $V_{incident}$ 332 and the value of the amplified difference signal 404 may be approximately equal to $kV_{incident}$ and the characteristic impedance ("$Z_0$") of the integrated directional bridge 400 may be expressed as:

$$Z_0 = \frac{Z_1(Z_2 + Z_3)}{Z_1 + Z_2 - \frac{Z_3 Z_4}{Z_5}},$$

where $Z_0$ is independent of $Z_{source}$ 304, $Z_{load}$ 306, and the differential input impedance ("$Z_D$") 406 of the differential amplifier 402. It is appreciated by those skilled in the art that $Z_0$ may differ from an ideal desired $Z_0$ due to accidental (for example, process variations) or intentional changes in the impedance values of $Z_1$ through $Z_5$ and the directional bridge may still have satisfactory performance even if the difference signal 404 may not be exactly equal to $kV_{incident}$.

Similarly, in FIG. 5, a block diagram of an example of an implementation of an integrated directional bridge 500 utilizing a single-directional bridge topology with a differential amplifier 502 that produces an amplified difference signal 504 that is proportional to $V_{reflected}$ 334 is shown. In this example, the sensing element 322 of FIG. 3 is again a differential amplifier 502 and the integrated directional bridge 500 is configured to produce the amplified difference signal 504 that is proportional to $V_{reflected}$ 334 and the value of the amplified difference signal 504 may be approximately equal to $kV_{reflected}$ and $Z_0$ of the integrated directional bridge 500 may be expressed as:

$$Z_0 = \frac{Z_1(Z_2 + Z_3)}{\frac{Z_2 Z_5}{Z_3} - Z_1 - Z_4},$$

where $Z_0$ is again independent of $Z_{source}$ 304, $Z_{load}$ 306, and the $Z_D$ 506 of the differential amplifier 502. Again, it is appreciated that $Z_0$ may differ from the ideal desired $Z_0$ due to accidental (for example, process variation) or intentional changes in the impedance values of Z1 through Z5 and the directional bridge may still have satisfactory performance even if the difference signal 504 may not be exactly equal to $kV_{reflected}$.

In general, if the sensing element 322, FIG. 3, is a differential amplifier with amplifier gain equal to 1 and the differential input impedance equal to $Z_D$, the coupling factor of the integrated direction bridge 300 may be expressed by:

$$\text{Coupling\_factor} = \frac{Z_D\left[\frac{Z_1}{Z_2} + \frac{Z_1}{Z_3} + Z_0\left(\frac{1}{Z_3} + \frac{Z_1}{Z_2 Z_3} - \frac{Z_4}{Z_2 Z_5}\right)\right]}{Z_0\left[\frac{Z_1}{Z_2} - \frac{Z_4}{Z_D} + \left(1 + \frac{Z_4}{Z_5} + \frac{Z_4}{Z_D}\right)\left(1 + \frac{Z_D}{Z_2} + \frac{Z_D}{Z_3}\right)\right]}.$$

In general, this coupling factor relationship is applicable to both the integrated directional bridge examples shown in FIGS. 3 and 4, and approximately true for integrated directional bridge example shown in FIG. 5 when the amplifier gain is approximately equal to 1.

Expanding on these examples, the integrated directional bridge may be implemented in a split ground implementation that is suitable for transmission media with separate ground planes such as, for example, coplanar waveguides.

Figure 6:
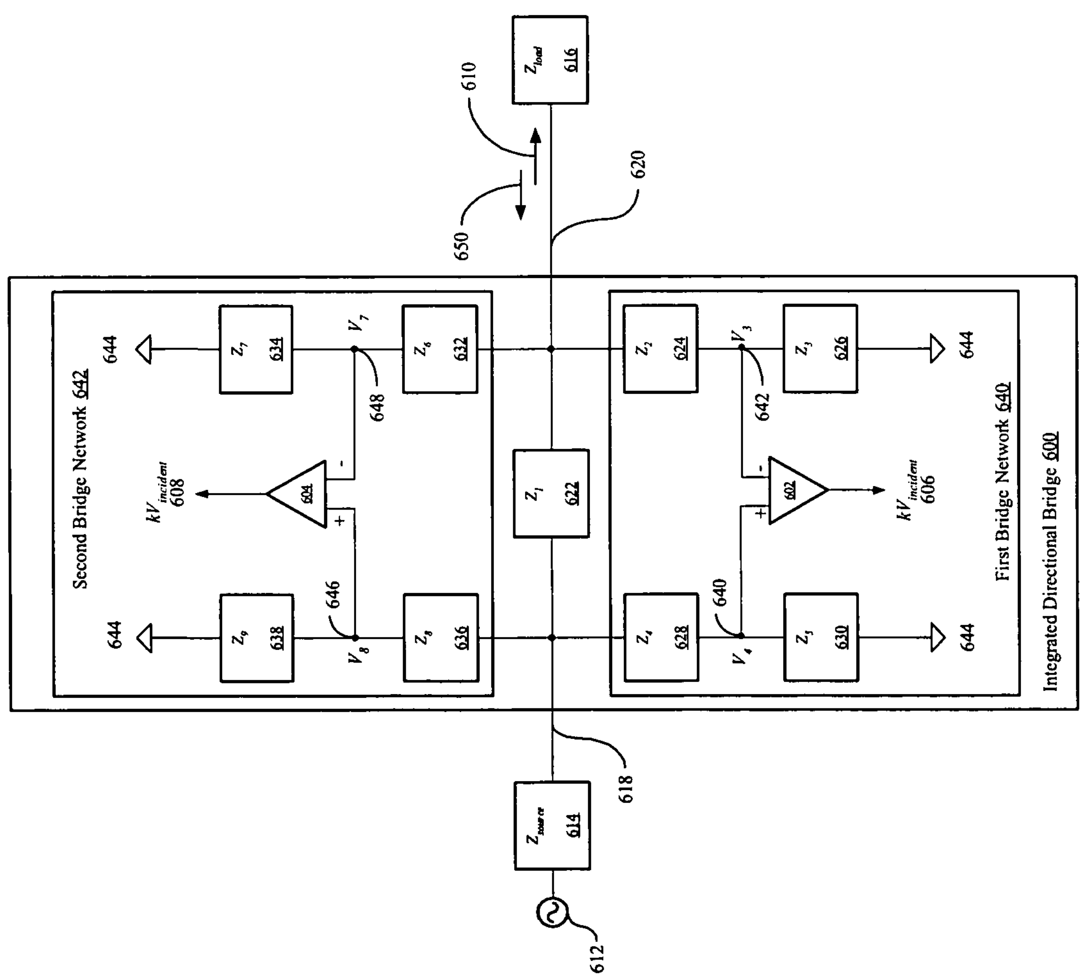
FIG. 6 is a block diagram of an example of an implementation of an integrated directional bridge utilizing a single-directional bridge topology with two differential amplifiers and a split ground that produces two amplified difference signals that are proportional to $V_{incident}$ 610.

In FIG. 6, a block diagram of an example of an implementation of an integrated directional bridge 600 utilizing a single-directional bridge topology with two differential amplifiers 602 and 604 and a split ground that produces two amplified difference signals 606 and 608, respectively, that are proportional to $V_{incident}$ 610 is shown. The integrated directional bridge 600 may be in signal communication with a signal source 612 having a signal source impedance $Z_{source}$ 614 and a load having a load impedance $Z_{load}$ 616 via signal paths 618 and 620, respectively. The integrated directional bridge 600 may include the two differential amplifiers 602 and 604 and impedance elements $Z_1$ 622, $Z_2$ 624, $Z_3$ 626, $Z_4$ 628, $Z_5$ 630, $Z_6$ 632, $Z_7$ 634, $Z_8$ 636, and $Z_9$ 638, where $Z_2$ 624 is equal in impedance value to $Z_6$ 632, $Z_3$ 626 is equal in impedance value to $Z_7$ 634, $Z_4$ 628 is equal in impedance value to $Z_8$ 636, and $Z_5$ 630 is equal in impedance value to $Z_9$ 638. Additionally, it is appreciated that because the integrated directional bridge utilizes two bridge networks 640 and 642 in a split ground configuration that are in parallel to each other, the impedance element $Z_1$ 622 in FIG. 6 may be equal in impedance value to $Z_1$ 312 in FIG. 3, $Z_2$ 624 and $Z_6$ 632 in FIG. 6 may be equal to twice the impedance value of $Z_2$ 314 in FIG. 3, $Z_3$ 626 and $Z_7$ 634 in FIG. 6 may be equal to twice the impedance value of $Z_3$ 316 in FIG. 3, $Z_4$ 628 and $Z_8$ 636 in FIG. 6 may be equal to twice the impedance value of $Z_4$ 318 in FIG. 3, and $Z_5$ 630 and $Z_9$ 638 in FIG. 6 may be equal to twice the impedance value of $Z_5$ 320 in FIG. 3. It is also appreciated that $Z_1$ 622 may be the parallel combination of two impedances that are the series elements of the bridge networks 640 and 642, each with an impedance value of twice $Z_1$.

In the example single-directional bridge split ground topology, $Z_{source}$ 614 is in signal communication with impedance elements $Z_1$ 622, $Z_4$ 628, and $Z_8$ 636. $Z_{load}$ 306 is in signal communication with impedance elements $Z_1$ 622, $Z_2$ 624, and $Z_6$ 632. The differential amplifier 602 is in signal communication with both $Z_4$ 628 and $Z_5$ 630 at node 640 having a node voltage $V_4$. The differential amplifier 602 is also in signal communication with both $Z_2$ 624 and $Z_3$ 626 at node 642 having a node voltage $V_3$. Both $Z_5$ 630 and $Z_3$ 626 are in signal communication with a common ground 644. Similarly, the differential amplifier 604 is in signal communication with both $Z_8$ 636 and $Z_9$ 638 at node 646 having a node voltage $V_8$. The differential amplifier 604 is also in signal communication with both $Z_6$ 632 and $Z_7$ 634 at node 648 having a node voltage $V_7$. Both $Z_7$ 634 and $Z_9$ 638 are in signal communication with a common ground 644.

As an example of operation, it is appreciated that a passive load $Z_{load}$ 616 produces $V_{reflected}$ 650 by reflecting $V_{incident}$ 610 and that if $Z_{load}$ 616 is an active device, $Z_{load}$ 616 may generate that $V_{reflected}$ 650 and the integrated directional bridge 600 may be configured to produce amplified difference signals 606 and 608 that are proportional to $V_{incident}$ 610 and the value of these amplified difference signals 606 and 608 may be approximately equal to $kV_{incident}$, where k is equal to the amplifier gain of the differential amplifiers 602 and 604.

Figure 7:
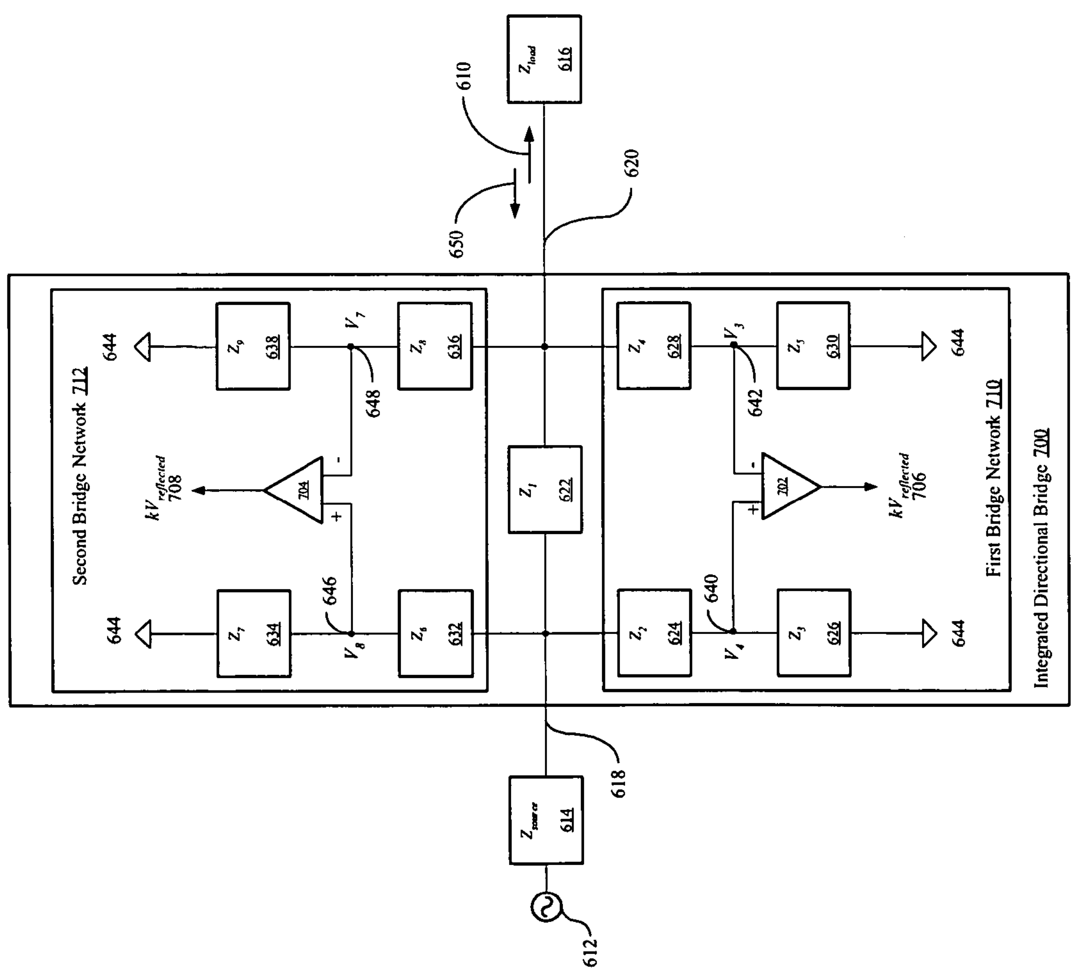
FIG. 7 is a block diagram of an example of an implementation of an integrated directional bridge utilizing a single-directional bridge topology with two differential amplifiers and a split ground that produces two amplified difference signals that are proportional to $V_{reflected}$.

Similar to the example in FIG. 6, in FIG. 7, a block diagram of an example of an implementation of an integrated directional bridge 700 utilizing a single-directional bridge topology with two differential amplifiers 702 and 704 and a split ground that produces two amplified difference signals 706 and 708 that are proportional to $V_{reflected}$ 650 is shown. For example purposes, the impedance values in the first bridge network 710 and second bridge network 712 are the same as in the example shown in FIG. 6. As an example of operation, the integrated directional bridge 700 is configured to produce amplified difference signals 706 and 708 that are proportional to $V_{reflected}$ 650 and the value of these amplified difference signals 706 and 708 may be approximately equal to $kV_{reflected}$, where k is equal to the amplifier gain of the differential amplifiers 706 and 708 multiplied by the coupling factor of the directional bridge.

It is appreciated that diodes (not shown) may be connected from the through-paths 618 and 620 to ground to add protection to the integrated directional bridge 700. Additionally, one or more diodes may be optionally connected in series so that in operation the RF signal from the source 612 is not appreciably affected by the diodes. Additionally, it is appreciated that these diodes may be utilized with all the implementation examples of the integrated directional bridge.

Figure 8:
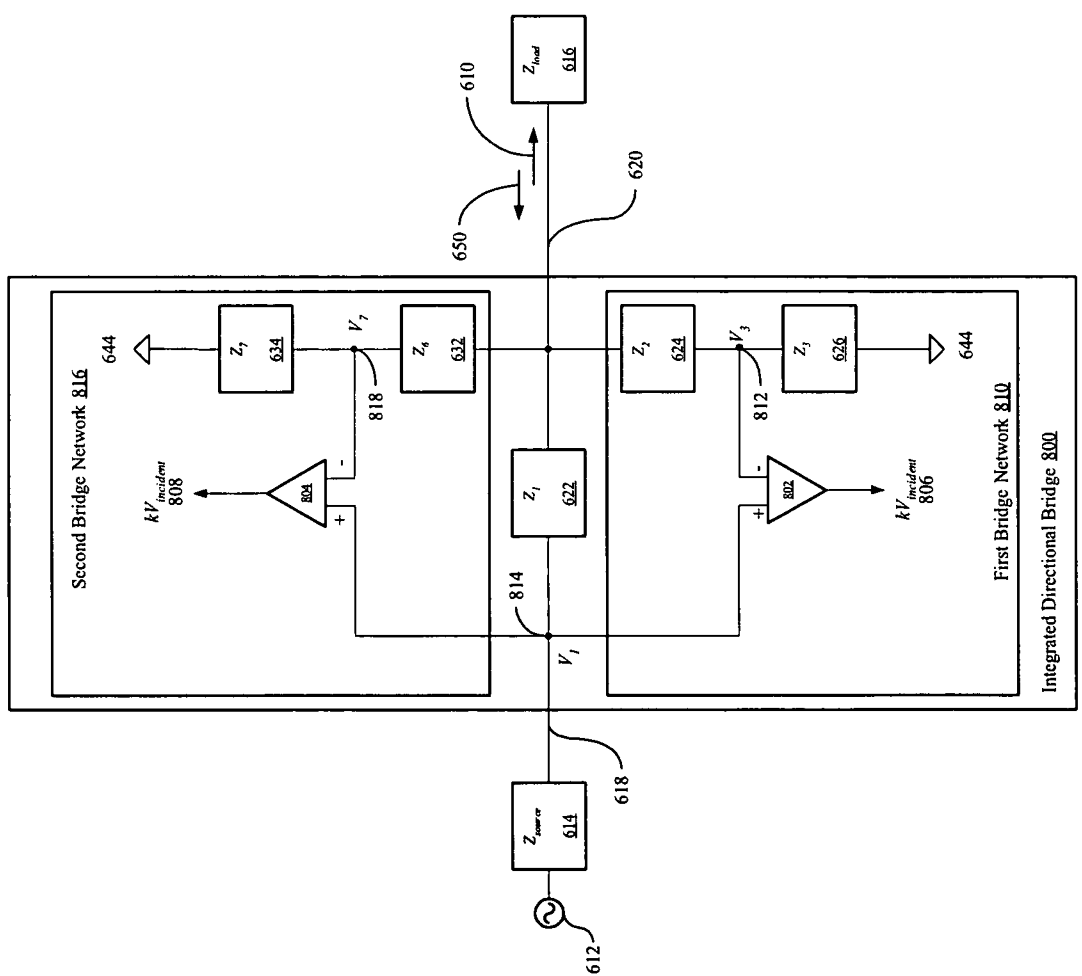
FIG. 8 is a block diagram of another example of an implementation of an integrated directional bridge utilizing another single-directional bridge topology with two differential amplifiers and a split ground that produces two amplified difference signals that are proportional to $V_{incident}$ 610.

In FIG. 8, a block diagram of another example of an implementation of an integrated directional bridge 800 utilizing another single-directional bridge topology with two differential amplifiers 802 and 804 and a split ground that produces two amplified difference signals 806 and 808 that are proportional to $V_{incident}$ 610, is shown. In this example, $Z_4$ 628, and, $Z_8$ 636, from FIG. 6 are shorted (set to zero impedance) and $Z_5$ 630 and $Z_9$ 638 are opened (set to infinite impedance), so that $Z_{source}$ 614 is in signal communication with $Z_1$ 622 and the differential amplifiers 802 and 804. The first differential amplifier 802 in the first bridge network 810 produces the amplified difference signal 806 that may be approximately equal to $kV_{incident}$ from the sensed voltage difference between voltage nodes $V_3$ 812 and $V_1$ 814. Similarly, the second differential amplifier 808 in the second bridge network 816 produces the amplified difference signal 808 that may be approximately equal to $kV_{incident}$ from the sensed voltage difference between voltage nodes $V_7$ 818 and $V_1$ 814.

Figure 9:
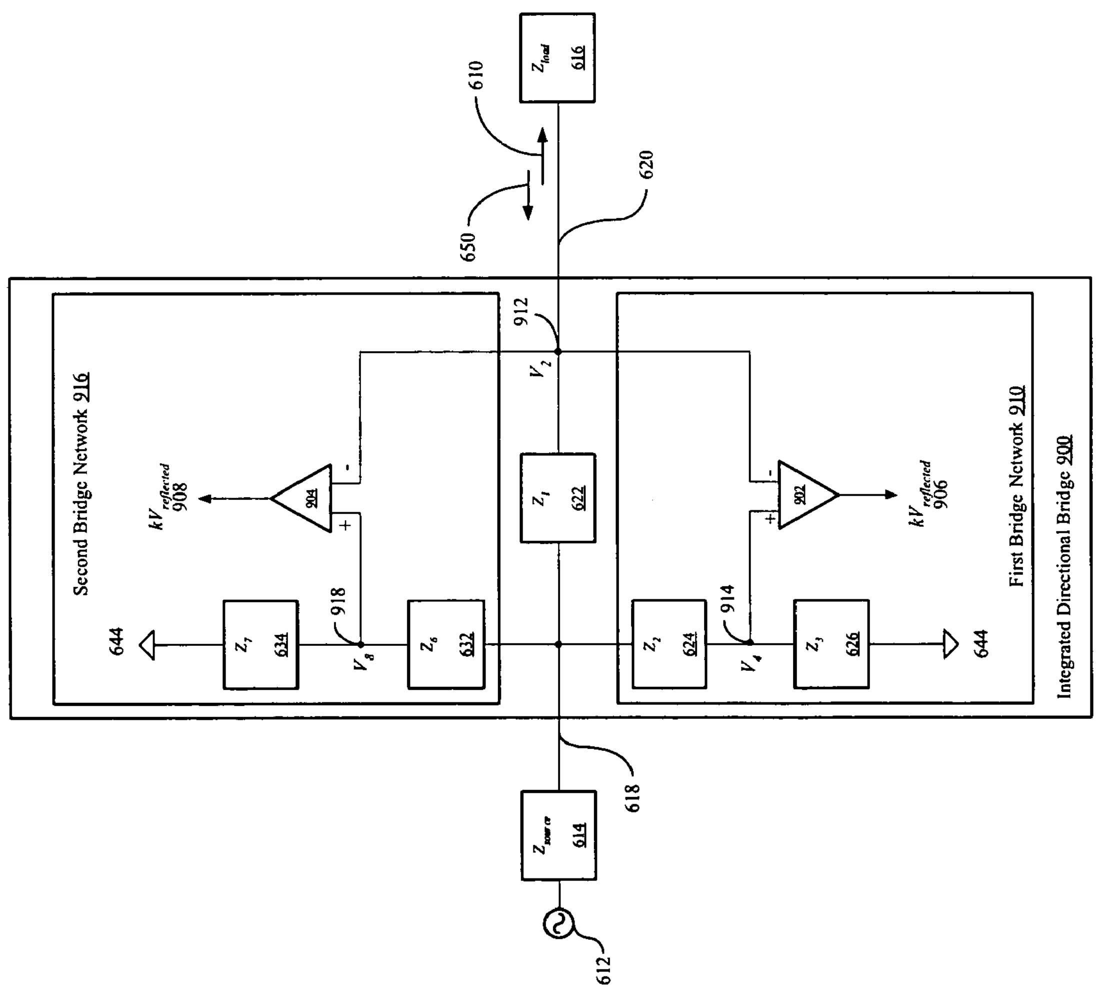
FIG. 9 is a block diagram of another example of an implementation of an integrated directional bridge utilizing another single-directional bridge topology with two differential amplifiers and a split ground that produces two amplified difference signals that are both proportional to $V_{reflected}$.

Similarly, in FIG. 9, a block diagram of another example of an implementation of an integrated directional bridge 900 utilizing another single-directional bridge topology with two differential amplifiers 902 and 904 and a split ground that produces two amplified difference signals 906 and 908 that are both proportional to $V_{reflected}$ 650 is shown. In this example, $Z_4$ 628 and $Z_8$ 636 from FIG. 7 are shorted (set to zero impedance) and $Z_5$ 630 and $Z_9$ 638 opened (set to infinite impedance), so that $Z_{load}$ 616 is in signal communication with $Z_1$ 622 and the differential amplifiers 902 and 904. The first differential amplifier 902 in the first bridge network 910 produces the amplified difference signal 906 that may be approximately equal to $kV_{reflected}$ from the sensed voltage difference between voltage nodes $V_2$ 912 and $V_4$ 914. Similarly, the second differential amplifier 908 in the second bridge network 916 produces the amplified difference signal 908 that may be approximately equal to $kV_{reflected}$ from the sensed voltage difference between voltage nodes $V_8$ 918 and $V_2$ 912.

Figure 10:
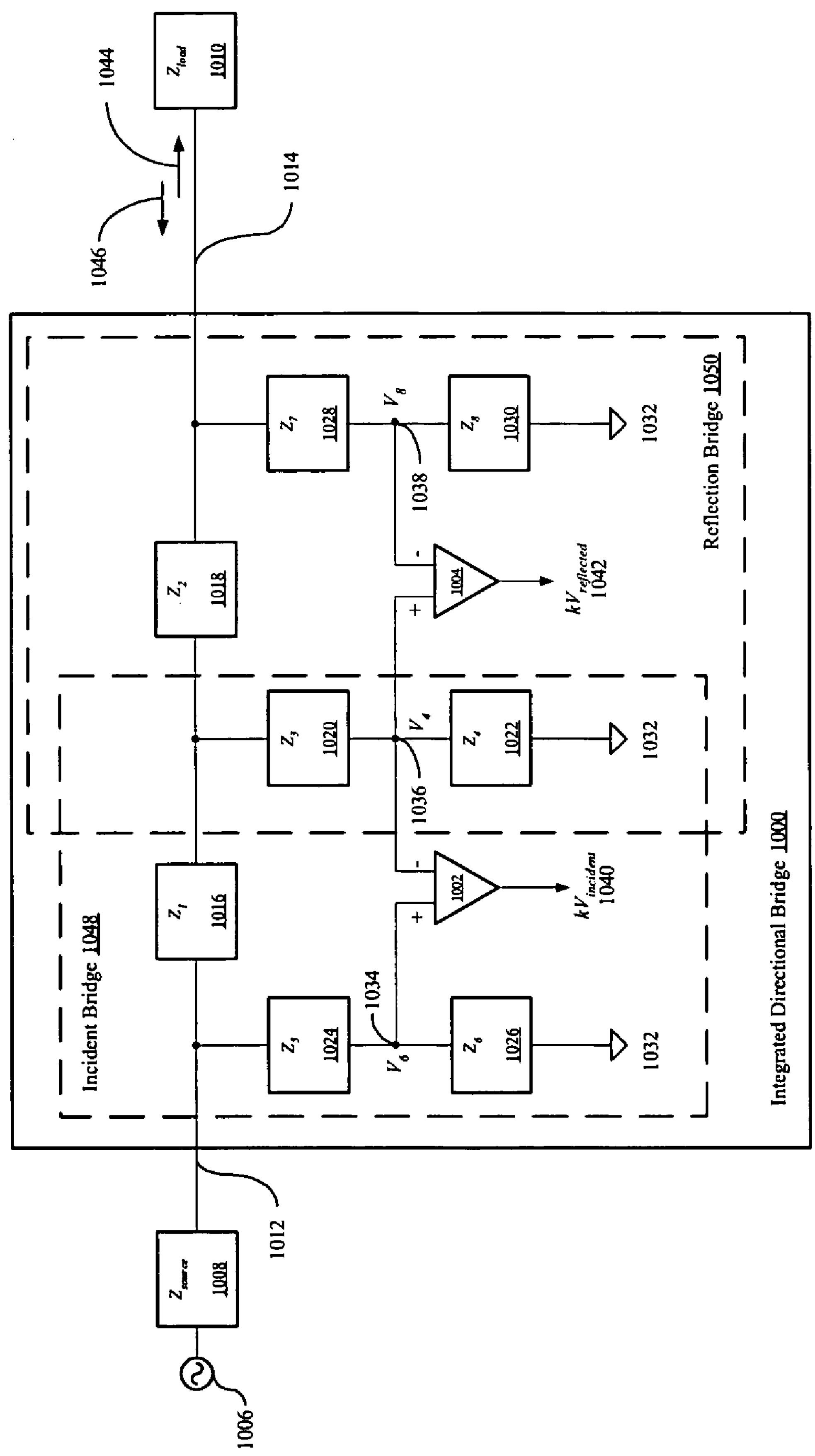
FIG. 10 is a block diagram of another example of an implementation of an integrated directional bridge utilizing a dual-directional bridge topology with two differential amplifiers.

In FIG. 10, a block diagram of another example of an implementation of an integrated directional bridge 1000 utilizing a dual-directional bridge topology with two differential amplifiers 1002 and 1004 is shown. Similar to FIGS. 3 through 9, the integrated directional bridge 1000 may be in signal communication with a signal source 1006 having a signal source impedance $Z_{source}$ 1008 and a load having a load impedance $Z_{load}$ 1010 via signal paths 1012 and 1014, respectively.

The integrated directional bridge 1000 may include the two differential amplifiers 1002 and 1004 and impedance elements $Z_1$ 1016, $Z_2$ 1018, $Z_3$ 1020, $Z_4$ 1022, $Z_5$ 1024, $Z_6$ 1026, $Z_7$ 1028, and $Z_8$ 1030. In the example single-directional bridge topology, the signal source impedance $Z_{source}$ 1008 is in signal communication with both impedance elements $Z_1$ 1016 and $Z_5$ 1024. The load impedance $Z_{load}$ 1010 is in signal communication with both impedance elements $Z_2$ 1018 and $Z_7$ 1028. $Z_3$ 1020 is in signal communication with $Z_1$ 1016, $Z_2$ 1018, $Z_4$ 1022, and differentiation amplifiers 1002 and 1004. $Z_5$ 1024 is in signal communication with $Z_6$ 1026 and differential amplifier 1002. Similarly, $Z_7$ 1028 is in signal communication with $Z_8$ 1030 and differential amplifier 1004. $Z_4$ 1022, $Z_6$ 1026, and $Z_8$ 1030 are in signal communication with a common ground 1032. The first differential amplifier 1002 is in signal communication with both $Z_5$ 1024 and $Z_6$ 1026 at node 1034 having a node voltage $V_6$ and $Z_3$ 1020 and $Z_4$ 1022 at node 1036 having a node voltage $V_4$. Similarly, the second differential amplifier 1004 is in signal communication with both $Z_7$ 1028 and $Z_8$ 1030 at node 1038 having a node voltage $V_8$ and $Z_3$ 1020 and $Z_4$ 1022 at node 1036.

The impedance elements $Z_1$ 1016, $Z_2$ 1018, $Z_3$ 1020, $Z_4$ 1022, $Z_5$ 1024, $Z_6$ 1026, $Z_7$ 1028, and $Z_8$ 1030 may be either reactive impedance elements, real impedance elements, or combinations of real and reactive elements based on the frequency range of operation of the integrated direction bridge 1000. The differential amplifiers 1002 and 1004 may be any sensing element type device including a DC-coupled differential amplifier with a high common mode rejection ratio, a Gilbert Cell mixer with differential RF input, that senses the difference in voltage between node voltages $V_4$, $V_6$, and $V_8$ and produces difference signals 1040 and 1042 of the voltage difference between node voltages $V_4$ and $V_6$ and $V_4$ and $V_8$, respectively, in both magnitude and phase.

As an example of operation, it is again appreciated by those skilled in the art that the amplified difference signals 1040 and 1042 may be proportional to either $V_{incident}$ 1044 from the integrated directional bridge 1000 to $Z_{load}$ 1010 or $V_{reflected}$ 1046 from $Z_{load}$ 1010 to integrated directional bridge 1000. It is also appreciated that a passive $Z_{load}$ 1010 produces $V_{reflected}$ 1046 by reflecting $V_{incident}$ 1044. However, it is appreciated that $V_{reflected}$ 1046 may also be generated by $Z_{load}$ if $Z_{load}$ is an active device.

In this example the proportional factor k for both differential amplifier 1040 and 1042 may be configured to be equal, where k is equal to the amplifier gain of each differential amplifier 1002 and 1004 multiplied by the coupling factor of the directional bridge. It is appreciated that based on the values of the impedance elements $Z_1$ 1016, $Z_2$ 1018, $Z_3$ 1020, $Z_4$ 1022, $Z_5$ 1024, $Z_6$ 1026, $Z_7$ 1028, and $Z_8$ 1030, the integrated directional bridge 1000 may be configured to either produce amplified difference signals 1040 and 1042 that are proportional to either $V_{incident}$ 1044 or $V_{reflected}$ 1046.

In general, the integrated directional bridge 1000 (also known as a "dual-directional bridge") may be formed by cascading two single-directional bridges described in FIGS. 3 to 5. The single-directional bridges may be described as an incident bridge 1048 that produces the amplified difference signal 1040 $kV_{incident}$ and a reflected bridge 1050 that produces the amplified difference signal 1042 $kV_{reflected}$. In this example of an implementation, the impedance values of $Z_3$ 1020 and $Z_4$ 1022 are set to equal half the impedance values of $Z_2$ 314 and $Z_3$ 316 of FIG. 3, $Z_5$ 1024 and $Z_7$ 1028 are set to equal $Z_4$ 318 of FIG. 3, and $Z_6$ 1026 and $Z_8$ 1030 are set to equal $Z_5$ 320 of FIG. 3. In general, the input and output impedance of the signal directional bridge nearest $Z_{load}$ 1010 is configured to be equal to $Z_0$. It is appreciated that the order of the incident bridge 1048 and reflection bridge 1050 may optionally be reversed so that the nearest single directional bridge closest to $Z_{load}$ 1010 may instead produce an amplified difference signal 1040 $kV_{incident}$ as shown in FIG. 11.

Figure 11:
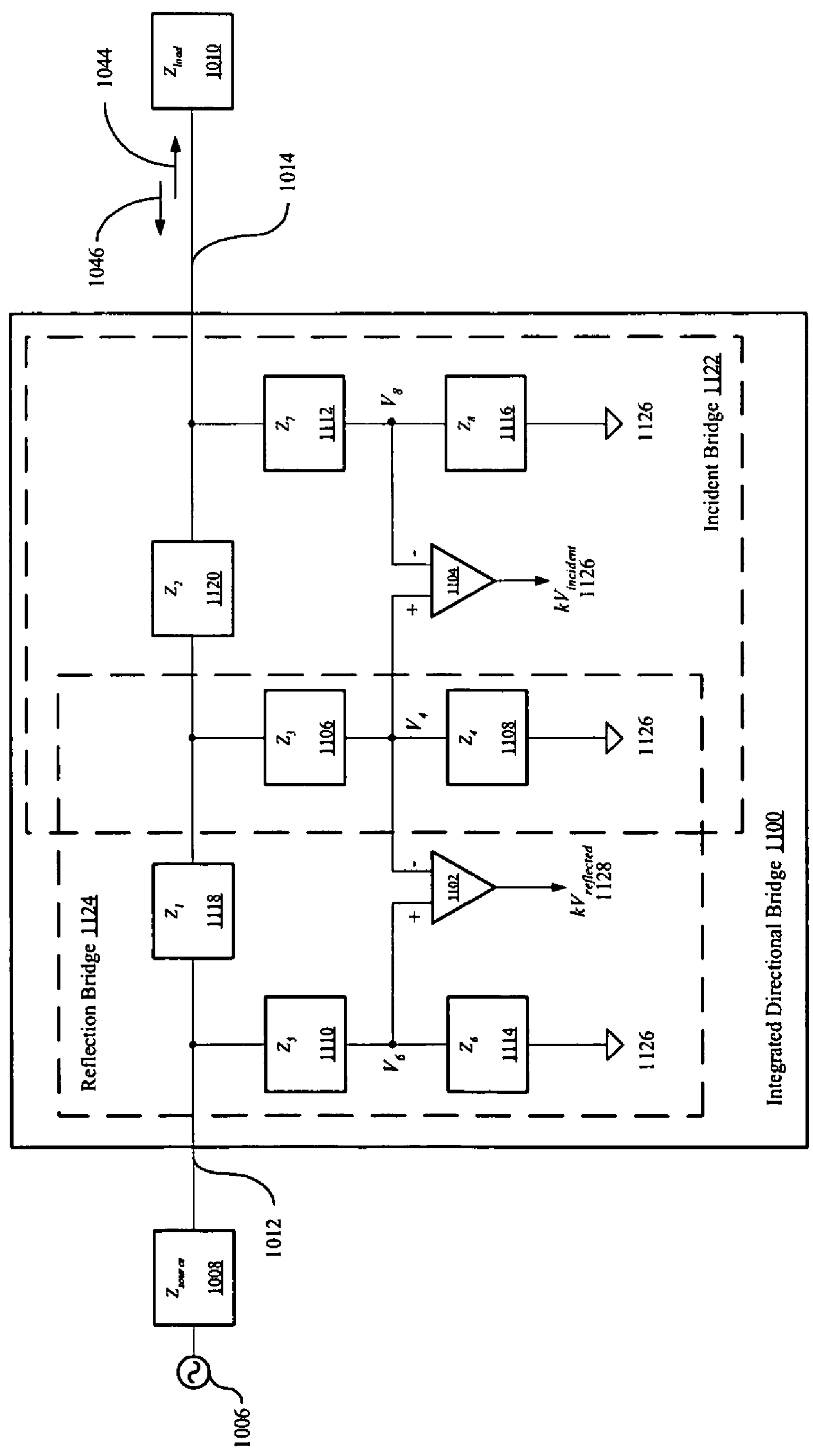
FIG. 11 is a block diagram of another example of an implementation of an integrated directional bridge utilizing another dual-directional bridge topology with two differential amplifiers.

In FIG. 11, a block diagram of another example of an implementation of an integrated directional bridge 1100 utilizing another dual-directional bridge topology with two differential amplifiers 1102 and 1104 is shown. This example is similar to the implementation shown in FIG. 10 except that the impedances $Z_3$ 1106 and $Z_4$ 1108 are equal to half the impedance values of $Z_4$ 318 and $Z_5$ 320 of FIG. 3, respectively. Additionally, $Z_5$ 1110 and $Z_7$ 1112 are equal to the impedance value of $Z_2$ 314 of FIG. 3 and $Z_6$ 1114 and $Z_8$ 1116 are equal to the impedance value of $Z_3$ 316 of FIG. 3. Similar to FIG. 10, $Z_1$ 1118 and $Z_2$ 1120 are equal to the impedance value of $Z_1$ 312 of FIG. 3. Again, $Z_4$ 1108, $Z_6$ 1114, and $Z_8$ 1116 are in signal communication with a common ground 1126.

As such, the integrated directional bridge 1100 may include two cascading single-directional bridges such as incident bridge 1122 and reflection bridge 1124. The incident bridge 1122 produces the amplified difference signal 1126 $kV_{incident}$ with differential amplifier 1104 and the reflected bridge 1124 produces the amplified difference signal 1128 $kV_{reflected}$ with differential amplifier 1102.

Figure 12:
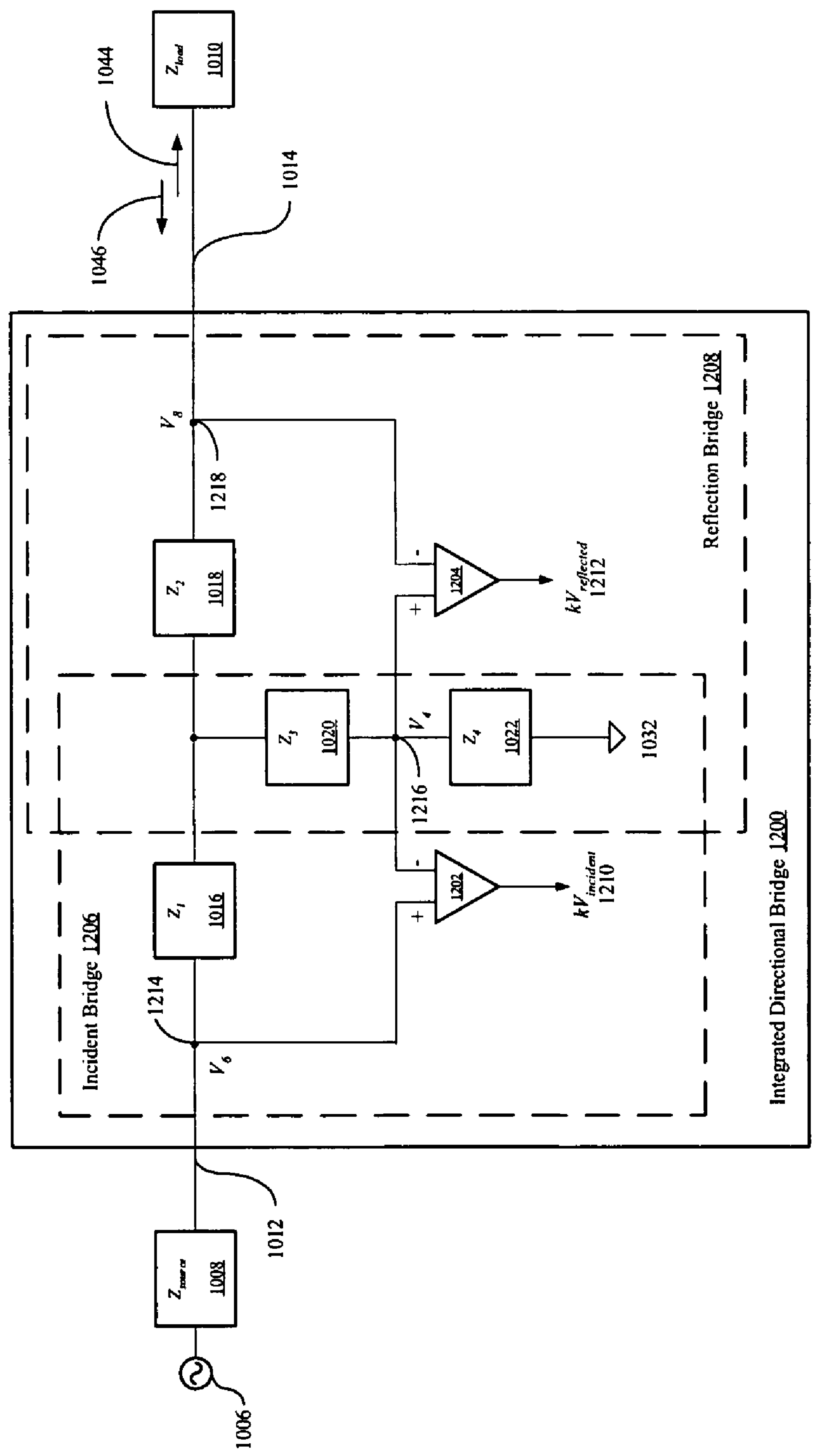
FIG. 12 is a block diagram of another example of an implementation of an integrated directional bridge utilizing another dual-directional bridge topology with two differential amplifiers.

In FIG. 12, a block diagram of another example of an implementation of an integrated directional bridge 1200 utilizing another dual-directional bridge topology with two differential amplifiers 1202 and 1204 is shown. The integrated directional bridge 1200 may include two cascading single-directional bridges such as incident bridge 1206 and reflection bridge 1208. The incident bridge 1206 produces an amplified difference signal 1210 $kV_{incident}$ with differential amplifier 1202 and the reflected bridge 1208 produces the amplified difference signal 1212 $kV_{reflected}$ with differential amplifier 1204. This implementation example is the same as the implementation shown in FIG. 10 except that, similar to the example shown in FIG. 8, $Z_5$ 1024 and $Z_7$ 1028 are shorted and $Z_6$ 1026 and $Z_8$ 1030 are open circuited, so that $Z_{load}$ 1010 is in signal communication with $Z_2$ 1018 and the differential amplifier 1204 and $Z_{source}$ 1008 is in signal communication with $Z_1$ 1016 and the differential amplifier 1202.

The first differential amplifier 1202 in the incident bridge 1206 produces the amplified difference signal 1210 that may be approximately equal to $kV_{incident}$ from the sensed voltage difference between voltage nodes $V_6$ 1214 and $V_4$ 1216. Similarly, the second differential amplifier 1204 in the reflected bridge 1208 produces the amplified difference signal 1212 that may be approximately equal to $kV_{reflected}$ from the sensed voltage difference between voltage nodes $V_8$ 1218 and $V_4$ 1216.

Figure 13:
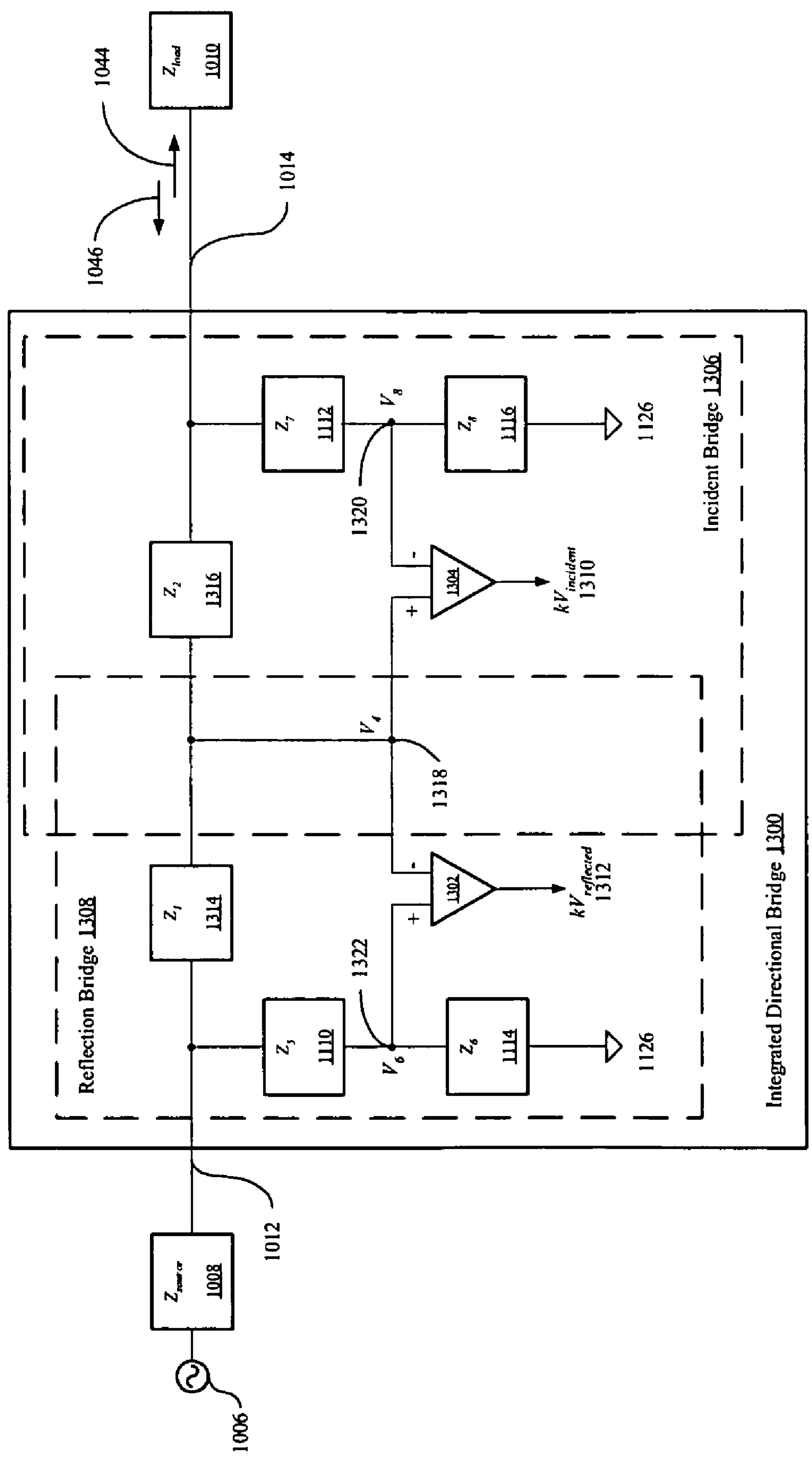
FIG. 13 is a block diagram of another example of an implementation of an integrated directional bridge utilizing another dual-directional bridge topology with two differential amplifiers.

Similarly, in FIG. 13, a block diagram of another example of an implementation of an integrated directional bridge 1300 utilizing another dual-directional bridge topology with two differential amplifiers 1302 and 1304 is shown. The integrated directional bridge 1300 may include two cascading single-directional bridges such as incident bridge 1306 and reflection bridge 1308. The incident bridge 1306 produces an amplified difference signal 1310 $kV_{incident}$ with differential amplifier 1304 and the reflected bridge 1308 produces the amplified difference signal 1312 $kV_{reflected}$ with differential amplifier 1302. This implementation example is the same as the implementation shown in FIG. 11 except that, similar to the example shown in FIG. 8, $Z_3$ 1106 is shorted and $Z_4$ 1108 is open circuited, so that $Z_1$ 1314, $Z_2$ 1316, and differential amplifiers 1302 and 1304 are in signal communication via node 1318 having node voltage $V_4$.

The first differential amplifier 1304 in the incident bridge 1306 produces the amplified difference signal 1310 that may be approximately equal to $kV_{incident}$ from the sensed voltage difference between voltage nodes $V_8$ 1320 and $V_4$ 1318. Similarly, the second differential amplifier 1302 in the reflected bridge 1308 produces the amplified difference signal 1312 that may be approximately equal to $kV_{reflected}$ from the sensed voltage difference between voltage nodes $V_6$ 1322 and $V_4$ 1318.

Figure 14:
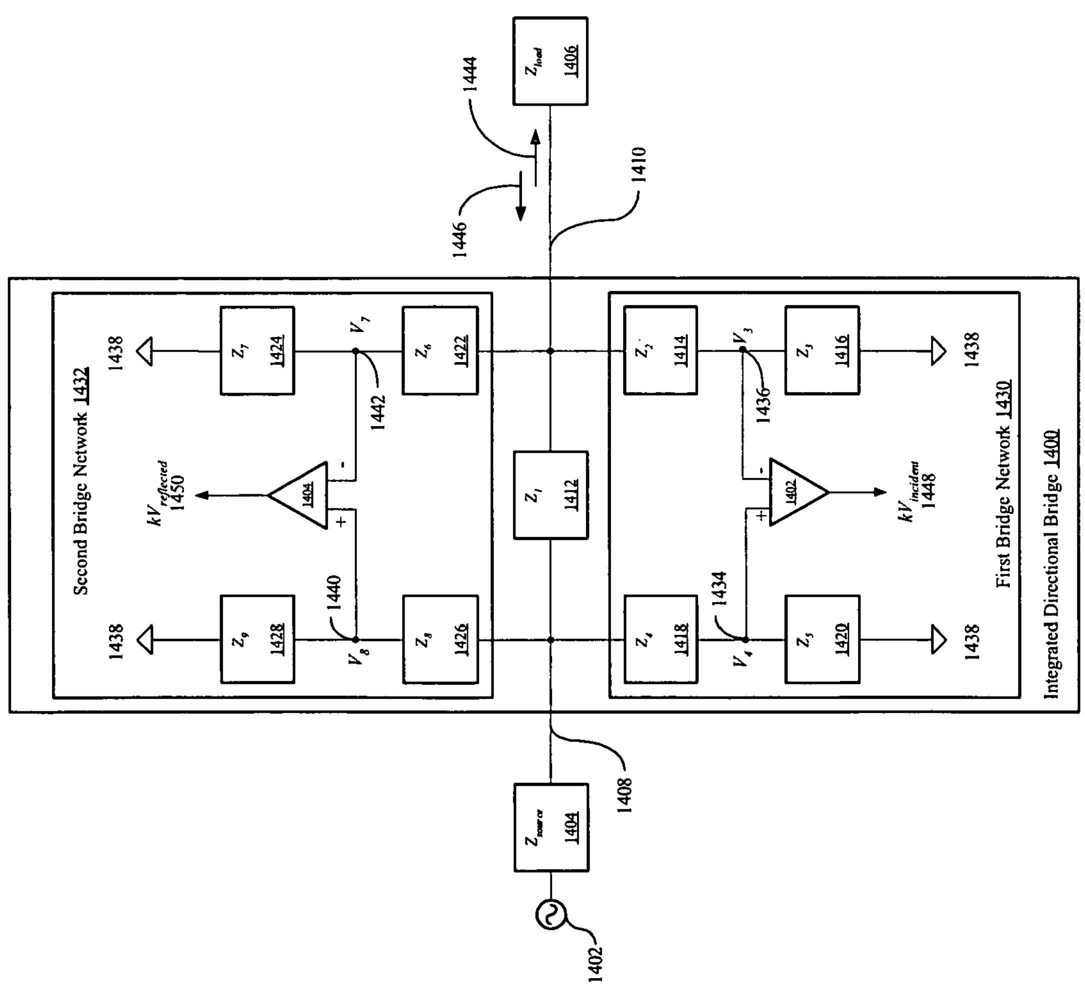
FIG. 14 is a block diagram of another example of an implementation of an integrated directional bridge utilizing a parallel dual-directional bridge topology with two differential amplifiers.

In FIG. 14, a block diagram of another example of an implementation of an integrated directional bridge 1400 utilizing a parallel dual-directional bridge topology with two differential amplifiers 1402 and 1404 is shown. The integrated directional bridge 1400 may be in signal communication with a signal source 1402 having a signal source impedance $Z_{source}$ 1404 and a load having a load impedance $Z_{load}$ 1406 via signal paths 1408 and 1410, respectively. The integrated directional bridge 1400 may include the two differential amplifiers 1402 and 1404 and impedance elements $Z_1$ 1412, $Z_2$ 1414, $Z_3$ 1416, $Z_4$ 1418, $Z_5$ 1420, $Z_6$ 1422, $Z_7$ 1424, $Z_8$ 1426, and $Z_9$ 1428, where $Z_2$ 1414 is equal in impedance value to $Z_8$ 1426, $Z_3$ 1416 is equal in impedance value to $Z_9$ 1428, $Z_4$ 1418 is equal in impedance value to $Z_6$ 1422, and $Z_5$ 1420 is equal in impedance value to $Z_7$ 1424. Additionally, it is appreciated that because the integrated direction bridge 1400 utilizes two single directional bridge networks (first bridge network 1430 and second bridge network 1432) in a split ground configuration that are in parallel to each other, the impedance element $Z_1$ 1412 may be equal in impedance value to $Z_1$ 312 in FIG. 3, $Z_2$ 1414 and $Z_8$ 1426 may be equal to twice the impedance value of $Z_2$ 314 in FIG. 3, $Z_3$ 1416 and $Z_9$ 1428 may be equal to twice the impedance value of $Z_3$ 316 in FIG. 3, $Z_4$ 1418 and $Z_6$ 1422 may be equal to twice the impedance value of $Z_4$ 318 in FIG. 3, and $Z_5$ 1420 and $Z_7$ 1424 may be equal to twice the impedance value of $Z_5$ 320 in FIG. 3.

In this example single-directional bridge split ground topology, $Z_{source}$ 1404 is in signal communication with impedance elements $Z_1$ 1412, $Z_4$ 1418, and $Z_8$ 1426. $Z_{load}$ 1406 is in signal communication with impedance elements $Z_1$ 1412, $Z_2$ 1414, and $Z_6$ 1422. The differential amplifier 1402 is in signal communication with both $Z_4$ 1418 and $Z_5$ 1420 at node 1434 having a node voltage $V_4$. The differential amplifier 1402 is also in signal communication with both $Z_2$ 1414 and $Z_3$ 1416 at node 1436 having a node voltage $V_3$. Both $Z_5$ 1420 and $Z_3$ 1416 are in signal communication with a common ground 1438. Similarly, the differential amplifier 1404 is in signal communication with both $Z_8$ 1426 and $Z_9$ 1428 at node 1440 having a node voltage $V_8$. The differential amplifier 1404 is also in signal communication with both $Z_6$ 1422 and $Z_7$ 1424 at node 1442 having a node voltage $V_7$. Both $Z_7$ 1424 and $Z_9$ 1428 are in signal communication with the common ground 1438.

As an example of operation, it is appreciated that $Z_{load}$ 1406 reflects $V_{incident}$ 1444 producing $V_{reflected}$ 1446 and the integrated directional bridge 1400 is configured to produce amplified difference signals 1448 and 1450 that are proportional to $V_{incident}$ 1444 and $V_{reflected}$ 1446, respectively. The values of these amplified difference signals 1448 and 1450 may be approximately equal to $kV_{incident}$ and $kV_{reflected}$, respectively, where k is equal to the amplifier gain of the differential amplifiers 1402 and 1404 multiplied by the coupling factor of the bridge. It is appreciated in this example that the characteristic impedance $Z_{0\_new}$ for both the single-directional first bridge network 1430 and second bridge network 1432 is equal to twice the characteristic impedance $Z_0$ of the integrated bridge 300 (also known as the "reference impedance for dual-directional bridge") shown in FIG. 3 (i.e., $Z_{0\_new}=2\ Z_0$). It is also appreciated that $Z_1$ 1412 may be the parallel combination of two impedances that are the series elements of the bridge networks 1430 and 1432, each with an impedance value of twice $Z_1$. Additionally, it is appreciated that (using the impedance labels in FIG. 14)

$$2Z_0 = Z_{0\_new} = \frac{2Z_1(Z_2+Z_3)}{2Z_1+Z_2-\frac{Z_3Z_4}{Z_5}} = \frac{2Z_1(Z_8+Z_9)}{\frac{Z_8Z_7}{Z_9}-2Z_1-Z_6}.$$

Figure 15:
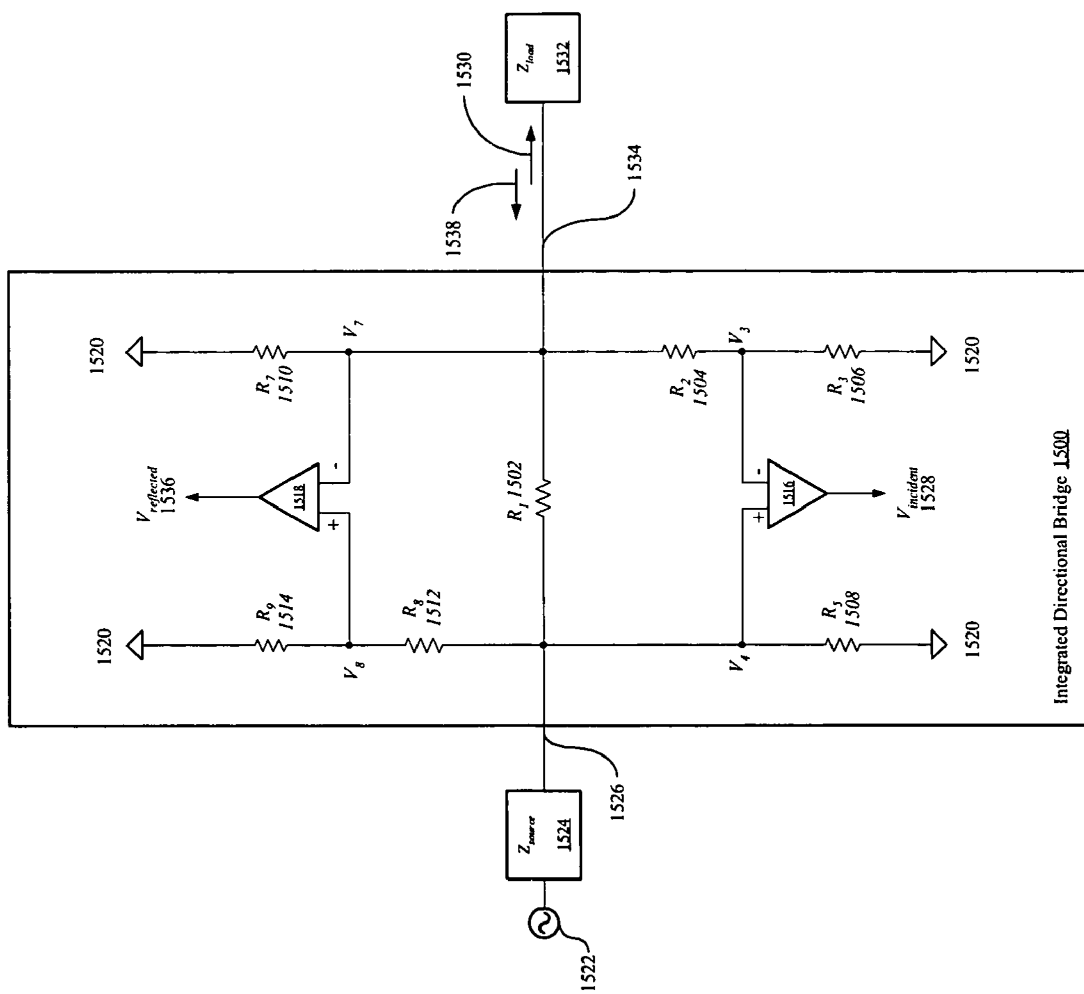
FIG. 15 is a block diagram of another example of an implementation of an integrated directional bridge utilizing the parallel dual-directional bridge topology shown in FIG. 14.

In FIG. 15, a block diagram of an example of an implementation of an integrated directional bridge 1500 utilizing the parallel dual-directional bridge topology of FIG. 14 is shown. In this example, the impedance value of $Z_5$ 1420 is set to equal approximately the impedance value of $Z_2$ 1414 plus the impedance value of $Z_3$ 1416 (i.e., $Z_5=Z_2+Z_3$). Because the impedance value of $Z_7$ 1424 is equal to the impedance value of $Z_5$ 1420, the impedance value of $Z_8$ 1426 is equal to the impedance value of $Z_2$ 1414, and the impedance value of $Z_9$ 1428 is equal to the impedance value of $Z_3$ 1416, $Z_7$ 1424 is set to equal approximately the impedance value of $Z_8$ 1426 plus the impedance value of $Z_9$ 1428 (i.e., $Z_7=Z_8+Z_9$). Additionally, $Z_4$ 1418 and $Z_6$ 1422 are shorted (i.e., $Z_4=Z_6=0$). In this example, the relationship between impedances may be described by the following relationships:

$$Z_2 = Z_0 - Z_1 + \sqrt{Z_1^2 + Z_0^2}; \text{ and}$$

$$Z_3 = \frac{Z_2^2}{2Z_1}.$$

If the impedances are real (i.e., the impedances are resistors) then $Z_1$ 1412 may be represented by $R_1$ 1502, $Z_2$ 1414 may be represented by $R_2$ 1504, $Z_3$ 1416 may be represented by $R_3$ 1506, $Z_5$ 1420 may be represented by $R_5$ 1508, $Z_7$ 1424 may be represented by $R_7$ 1510, $Z_8$ 1512 may be represented by $R_8$ 1512, and $Z_9$ 1428 may be represented by $R_9$ 1514. $R_3$ 1506, $R_5$ 1508, $R_7$ 1510, and $R_9$ 1514 are in signal communication with a common ground 1520. In this example, the integrated directional bridge 1500 would operate as a pi-attenuator to the RF through-path signal from the signal source 1522 having a signal source impedance $Z_{source}$ 1524 via signal path 1526.

For simplicity both the differential amplifiers 1516 and 1518 gain k may be assumed to equal to unity (i.e., 1) such that differential amplifier 1516 produces a differential output 1528 that is approximately equal to the incident voltage signal $V_{incident}$ 1530 incident on the $Z_{load}$ 1532 along signal path 1534 multiplied by the coupling factor of the directional bridge. Similarly, the differential amplifier 1518 produces a differential output 1536 that is approximately equal to the reflected voltage signal $V_{reflected}$ 1538 reflected by the $Z_{load}$ 1532 along signal path 1534 multiplied by the coupling factor of the directional bridge. As an example of operation, if $Z_0$ is equal to 50 ohms ("Ω"), $R_1$ 1502 is equal to 10 Ω, $R_2$ 1504 and $R_8$ 1512 are both equal to 182 Ω, $R_3$ 1506 and $R_9$ 1514 are both equal to 828 Ω, and $R_5$ 1508 and $R_7$ 1510 are both equal to 1010 Ω, the insertion loss would be −1.7 dB, and the incident coupling factor would be −8 dB. It is appreciated that in this example $R_1$ 1502 may be selected for the desired insertion loss.

Figure 16:
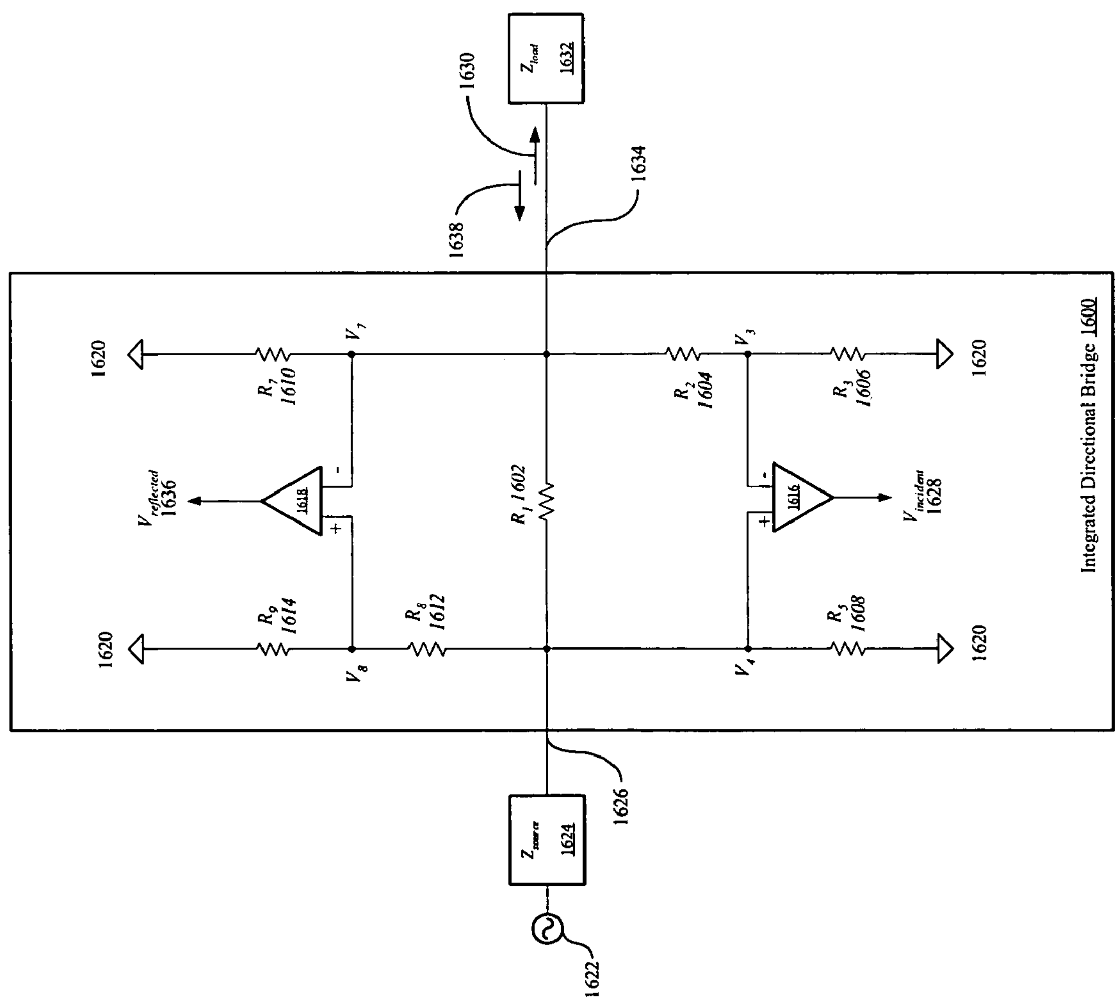
FIG. 16 is a block diagram of yet another example of an implementation of an integrated directional bridge utilizing the parallel dual-directional bridge topology shown in FIG. 14.

Similarly, in FIG. 16, a block diagram of another example of an implementation of an integrated directional bridge 1600 utilizing the parallel dual-directional bridge topology of FIG. 15 is shown. In this example, the impedance value of $Z_5$ 1420 is set to equal approximately the impedance value of $Z_3$ 1416 (i.e., $Z_5=Z_3$) and the $Z_4$ 1418 and $Z_6$ 1422 are shorted (i.e., $Z_4=Z_6=0$). Because the impedance value of $Z_7$ 1424 is equal to the impedance value of $Z_5$ 1420 and the impedance value of $Z_9$ 1428 is equal to the impedance value of $Z_3$ 1416, $Z_7$ 1424 is set to equal approximately the impedance value of $Z_9$ 1428 (i.e., $Z_7=Z_9$). Additionally, $Z_4$ 1418 and $Z_6$ 1422 are shorted (i.e., $Z_4=Z_6=0$). In this example, the relationship between impedances may be described by the following relationships:

$$Z_2 = 2Z_0; \text{ and}$$

$$Z_3 = \frac{2Z_0^2 - Z_0Z_1}{Z_1}.$$

If the impedances are real (i.e., the impedances are resistors) then $Z_1$ 1412 may be represented by $R_1$ 1602, $Z_2$ 1414 may be represented by $R_2$ 1604, $Z_3$ 1416 may be represented by $R_3$ 1606, $Z_5$ 1420 may be represented by $R_5$ 1608, $Z_7$ 1424 may be represented by $R_7$ 1610, $Z_8$ 1512 may be represented by $R_8$ 1612, and $Z_9$ 1428 may be represented by $R_9$ 1614. $R_3$ 1606, $R_5$ 1608, $R_7$ 1610, and $R_9$ 1614 are in signal communication with a common ground 1620. Again, the integrated directional bridge 1600 is in signal communication with a signal source 1622 having a signal source impedance $Z_{source}$ 1624 via signal path 1626.

Again, for simplicity both the differential amplifiers 1616 and 1618 gain k may be assumed to equal to unity such that differential amplifier 1616 produces a differential output 1628 that is approximately equal to the incident voltage signal $V_{incident}$ 1630 incident on the $Z_{load}$ 1632 along signal path 1634 multiplied by the coupling factor of the bridge. Similarly, the differential amplifier 1618 produces a differential output 1636 that is approximately equal to the reflected voltage signal $V_{reflected}$ 1638 reflected by the $Z_{load}$ 1632 along signal path 1634 multiplied by the coupling factor of the bridge. As an example of operation, if $Z_0$ is equal to 50 ohms ("Ω"), $R_1$ 1602 is equal to 10 Ω, $R_2$ 1604 and $R_8$ 1612 are both equal to 200 Ω, $R_3$ 1606 and $R_9$ 1614 are both equal to 900 Ω, and $R_5$ 1608 and $R_7$ 1610 are both equal to 900 Ω, the insertion loss would again be −1.7 dB, and the incident coupling factor would again be −8 dB. Again, it is appreciated that in this example $R_1$ 1502 may be selected for the desired insertion loss.

Figure 17:
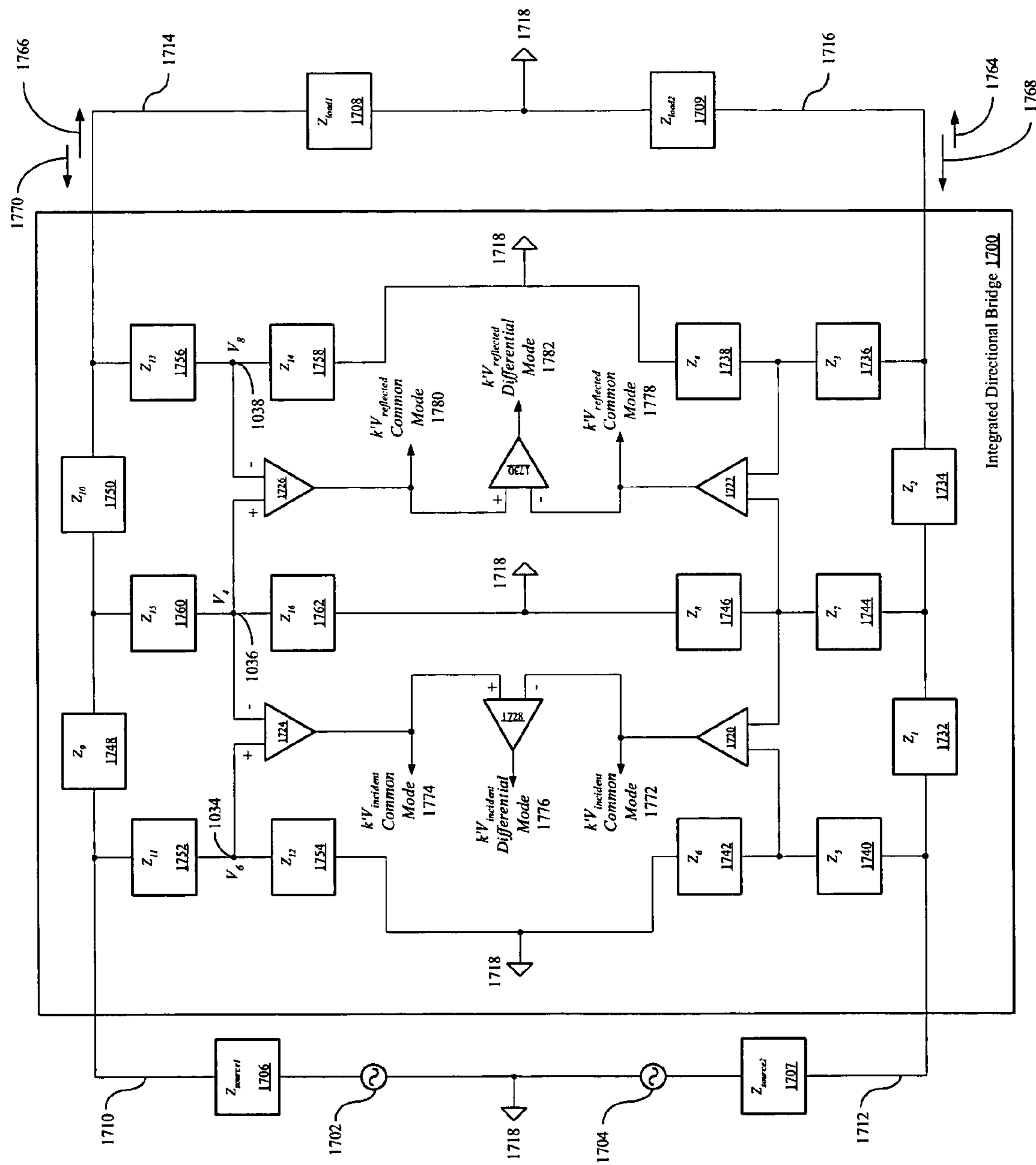
FIG. 17 is a block diagram of another example of an implementation of an integrated directional bridge for a fully balanced transmission system.

In FIG. 17, a block diagram of another example of an implementation of an integrated directional bridge 1700 for a fully balanced transmission system is shown. The integrated directional bridge 1700 is a dual-directional bridge that includes a series connection of single directional bridges and may operate as a directional bridge for both common and differential modes. The integrated directional bridge 1700 may be in signal communication with a signal sources 1702 and 1704 having a signal source impedances $Z_{source1}$ 1706 and $Z_{source2}$ 1708 and a load having load impedances $Z_{load1}$ 1708 and $Z_{load2}$ 1709 via signal paths 1710, 1712, 1714, and 1716, respectively. In this example, $Z_{source1}$ 1706 and $Z_{source2}$ 1708 are equal in impedance value and the common impedance value may be represented as "$Z_S$." Similarly, $Z_{load1}$ 1708 and $Z_{load2}$ 1709 are equal in impedance value and the common impedance value may be represented as "$Z_{load}$." The signal sources 1702 and 1704 are in signal communication with a common ground 1718. Additionally, the $Z_{load1}$ 1708 and $Z_{load2}$ 1709 are in signal communication with the common ground 1718. The integrated directional bridge 1700 may include six differential amplifiers 1720, 1722, 1724, 1726, 1728, and 1730 and impedance elements $Z_1$ 1732, $Z_2$ 1734, $Z_3$ 1736, $Z_4$ 1738, $Z_5$ 1740, $Z_6$ 1742, $Z_7$ 1744, $Z_8$ 1746, $Z_9$ 1748, $Z_{10}$ 1750, $Z_{11}$ 1752, $Z_{12}$ 1754, $Z_{13}$ 1756, $Z_{14}$ 1758, $Z_{15}$ 1760, and $Z_{16}$ 1762, where $Z_1$ 1732, $Z_2$ 1734, $Z_9$ 1748, and $Z_{10}$ 1750 are equal in impedance value to $Z_1$ 312 of FIG. 3, $Z_3$ 1736, $Z_5$ 1740, $Z_{11}$ 1752, and $Z_{13}$ 1756 are equal in impedance value to $Z_4$ 318 of FIG. 3, $Z_4$ 1738, $Z_6$ 1742, $Z_{12}$ 1754, and $Z_{14}$ 1758 are equal in impedance value to $Z_5$ 320 of FIG. 3, $Z_3$ 1736 and $Z_{15}$ 1760 are equal in impedance value to half the impedance value of $Z_2$ 314 of FIG. 3, and $Z_8$ 1746 and $Z_{16}$ 1762 are equal in impedance value to half the impedance value of $Z_3$ 316 of FIG. 3.

In an example operation, the amplified signals from difference amplifiers 1720, 1724, and 1728 are proportional to the incident voltage signals ("$V_{incident}$") 1764 and 1766 from the integrated directional bridge 1700 to $Z_{load1}$ 1708 and $Z_{load2}$ 1709, respectively. Similarly, the amplified signals from difference amplifiers 1722, 1726, and 1730 are proportional to the reflected voltage signals ("$V_{reflected}$") 1768 and 1770 produced by $Z_{load1}$ 1708 and $Z_{load2}$ 1709, respectively. If the proportional factor k' is assumed to be equal for all the difference amplifiers, the outputs of the individual difference amplifiers are the amplified common mode output 1772 $k'V_{incident}$ from differential amplifier 1720, the amplified common mode output 1774 $k'V_{incident}$ from differential amplifier 1724, the amplified difference mode output 1776 $k'V_{incident}$ from differential amplifier 1728, the amplified common mode output 1778 $k'V_{reflected}$ from differential amplifier 1722, the amplified common mode output 1780 $k'V_{reflected}$ from differential amplifier 1726, and the amplified difference mode output 1782 $k'V_{reflected}$ from differential amplifier 1730. In this example, it is appreciated that the differential mode reference impedance ("$Z_{Diff\_0}$") is approximately equal to twice $Z_S$ (i.e., $Z_{Diff\_0}=2Z_S$). Similarly, common mode reference impedance ("$Z_{Common\_0}$") is approximately equal to half the $Z_S$ (i.e., $Z_{Common\_0}=Z_S/2$).

Figure 18:
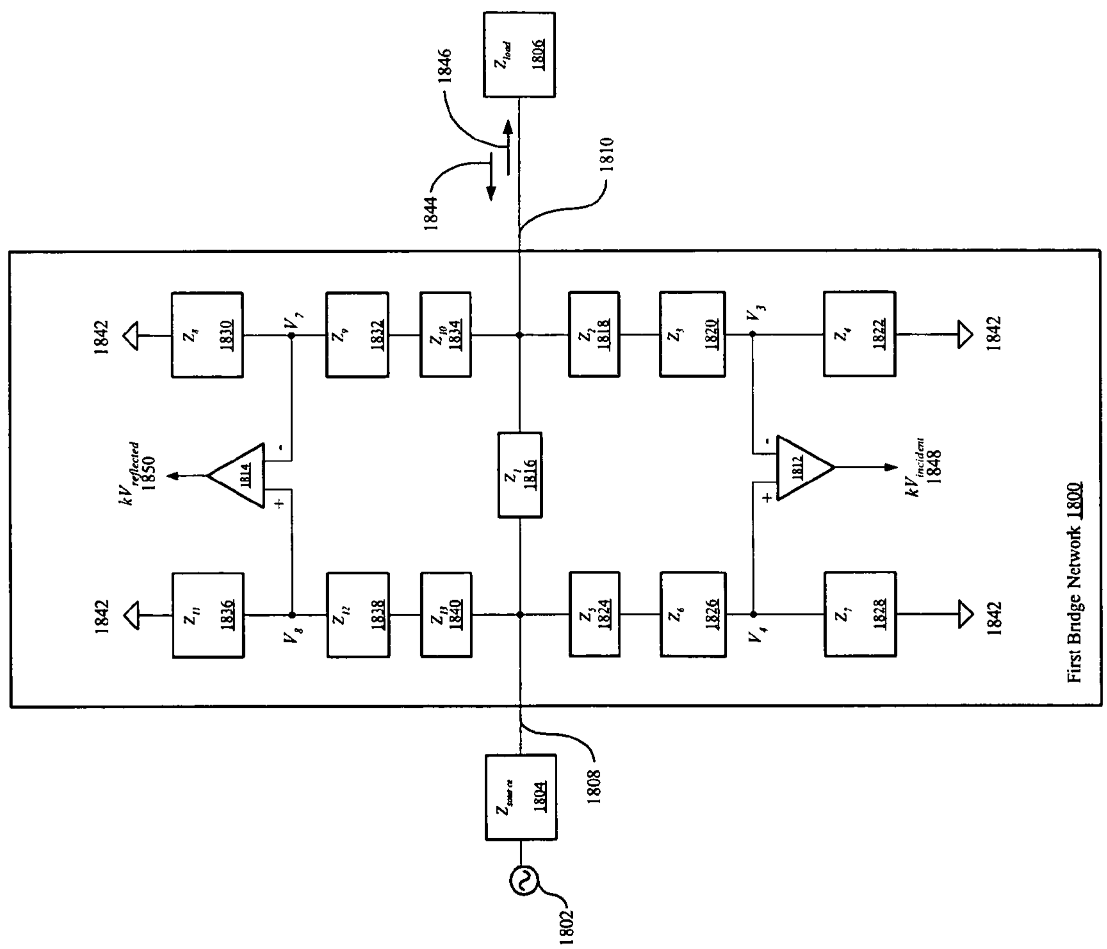
FIG. 18 is a block diagram of another example of an implementation of an integrated directional bridge utilizing an internal voltage divider for varying the coupling factor of the integrated bridge.

In FIG. 18, a block diagram of an example of an implementation of an integrated directional bridge 1800 utilizing an internal voltage divider to vary the coupling factor of the integrated directional bridge 1800 is shown. The integrated directional bridge 1800 may be in signal communication with a signal source 1802 having signal source impedance $Z_{source}$ 1804 and a load having load impedance $Z_{load}$ 1806 via signal paths 1808 and 1810, respectively. The integrated directional bridge 1800 may include two differential amplifiers 1812 and 1814 and impedance elements $Z_1$ 1816, $Z_2$ 1818, $Z_3$ 1820, $Z_4$ 1822, $Z_5$ 1824, $Z_6$ 1826, $Z_7$ 1828, $Z_8$ 1830, $Z_9$ 1832, $Z_{10}$ 1834, $Z_{11}$ 1836, $Z_{12}$ 1838, $Z_{13}$ 1840, where $Z_1$ 1816 is equal in impedance value to $Z_1$ 312 of FIG. 3, $Z_2$ 1818 and $Z_{13}$ 1840 are equal in impedance value to twice the impedance value of $Z_2$ 314 of FIG. 3, and $Z_5$ 1824 and $Z_{10}$ 1834 are equal in impedance value to twice the impedance value of $Z_4$ 318 of FIG. 3. $Z_4$ 1822, $Z_7$ 1828, $Z_8$ 1830, and $Z_{11}$ 1836 are in signal communication with a common ground 1842.

In this example, the differential mode and common mode voltages applied to the differential amplifiers 1812 and 1814 are reduced compared to the examples shown in FIGS. 3 and 6 by splitting the shunt elements $Z_3$ 316 and $Z_5$ 320 of FIG. 3 into two series elements to act as a voltage divider. As an example, $Z_3$ 1820 and $Z_4$ 1822 may be the two series elements of $Z_3$ 316 of FIG. 3 creating a first voltage divider, $Z_6$ 1826 and $Z_7$ 1828 may be the two series elements of $Z_5$ 320 of FIG. 3 creating a second voltage divider, $Z_8$ 1830 and $Z_9$ 1832 may be the two series elements of $Z_3$ 316 of FIG. 3 creating a third voltage divider, and $Z_{11}$ 1836 and $Z_{12}$ 1838 may be the two series elements of $Z_5$ 320 of FIG. 3 creating a fourth voltage divider. The ratio of impedances $Z_3$ 1820 to $Z_4$ 1822 is set to equal the ratio of impedances $Z_6$ 1826 to $Z_7$ 1828. Similarly, the ratio of impedances $Z_9$ 1832 to $Z_8$ 1830 is set to equal the ratio of impedances $Z_{12}$ 1838 to $Z_{11}$ 1836. As such, the ratio of the impedances may be represented as $$\frac{Z_3}{Z_4} = \frac{Z_6}{Z_7} \text{ and } \frac{Z_9}{Z_8} = \frac{Z_{12}}{Z_{11}}.$$

In this example, the decrease in bridge coupling factor and the decrease in common-mode voltage applied to the differential amplifiers 1812 and 1814 are determined by the voltage divider ratios of the voltage dividers.

It is appreciated that $Z_{load}$ 1806 produces $V_{reflected}$ 1844 by reflecting $V_{incident}$ 1846 and the integrated directional bridge 1800 is configured to produce amplified difference signals 1848 and 1850 that are proportional to $V_{incident}$ 1846 and the value of these amplified difference signals 1848 and 1850 may be approximately equal to $kV_{incident}$ and $kV_{reflected}$, where k is equal to the amplifier gain of the differential amplifiers 1812 and 1814 multiplied by the coupling factor of the bridge.

Figure 19:
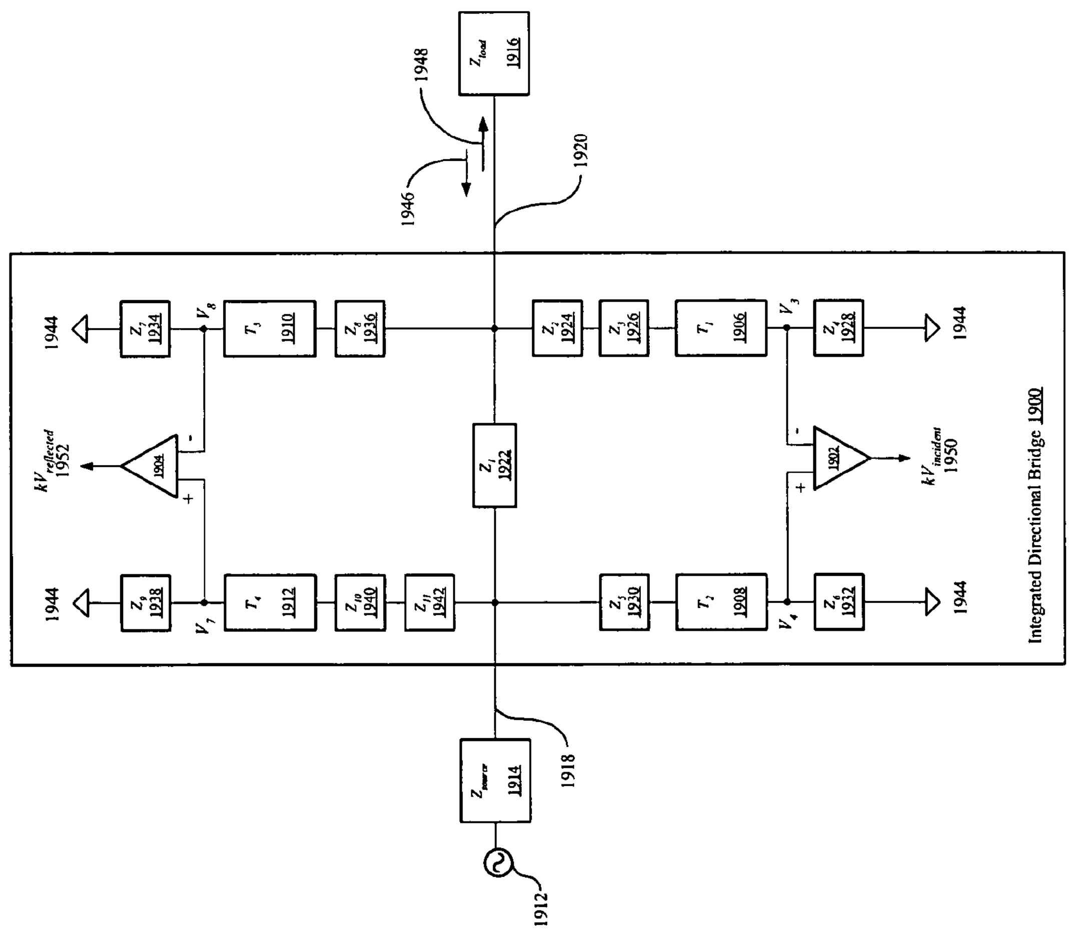
FIG. 19 is a block diagram of another example of an implementation of an integrated directional bridge utilizing a parallel dual-directional bridge topology with differential amplifiers connected to the integrated direction bridge via equal length transmission lines.

In FIG. 19, a block diagram of an example of an implementation of an integrated directional bridge 1900 utilizing a parallel dual-directional bridge topology with differential amplifiers 1902 and 1904 connected to the integrated direction bridge 1900 via equal length transmission lines $T_1$ 1906, $T_2$ 1908, $T_3$ 1910, and $T_4$ 1912 is shown. The characteristic impedance of transmission lines $T_1$ 1906, $T_2$ 1908, $T_3$ 1910, and $T_4$ 1912 may be represented by $Z_0'$. The integrated directional bridge 1900 may be in signal communication with a signal source 1912 having signal source impedance $Z_{source}$ 1914 and a load having load impedance $Z_{load}$ 1916 via signal paths 1918 and 1920, respectively. The integrated directional bridge 1900 may include the two differential amplifiers 1902 and 1904, four transmission lines $T_1$ 1906, $T_2$ 1908, $T_3$ 1910, and $T_4$ 1912 and impedance elements $Z_1$ 1922, $Z_2$ 1924, $Z_3$ 1926, $Z_4$ 1928, $Z_5$ 1930, $Z_6$ 1932, $Z_7$ 1934, $Z_8$ 1936, $Z_9$ 1938, $Z_{10}$ 1940, and $Z_{11}$ 1942, where $Z_1$ 1922 is equal in impedance value to $Z_1$ 312 of FIG. 3, $Z_2$ 1924 and $Z_{11}$ 1942 are equal in impedance value to twice the impedance value of $Z_2$ 314 of FIG. 3, $Z_4$ 1928, $Z_6$ 1932, $Z_7$ 1934, and $Z_9$ 1938 are equal in impedance value to the characteristic impedance $Z_0'$, $Z_3$ 1926 and $Z_{10}$ 1940 are equal in impedance value to twice the impedance value of $Z_3$ 316 of FIG. 3 minus the characteristic impedance $Z_0'$, and $Z_5$ 1930 and $Z_8$ 1936 are equal in impedance value to twice the impedance value of $Z_5$ 320 of FIG. 3 minus the characteristic impedance $Z_0'$. $Z_4$ 1928, $Z_6$ 1932, $Z_7$ 1934, and $Z_9$ 1938 are in signal communication with a common ground 1944.

It is again appreciated that passive load $Z_{load}$ 1916 produces $V_{reflected}$ 1946 by reflecting $V_{incident}$ 1948 (but $V_{reflected}$ 1946 may also be generated by $Z_{load}$ if $Z_{load}$ is an active device) and the integrated directional bridge 1900 is configured to produce amplified difference signals 1950 and 1952 that are proportional to $V_{incident}$ 1948 and the value of these amplified difference signals 1950 and 1952 may be approximately equal to $kV_{incident}$ and $kV_{reflected}$, where k is equal to the amplifier gain of the differential amplifiers 1902 and 1904 multiplied by the coupling factor of the directional bridge.

In an example of operation, the integrated directional bridge 1900 allows the differential amplifiers 1902 and/or 1904, or other sensing elements, to be located at a distance from the impedance bridge (that may be either on-chip or off-chip). The sensing elements may be in signal communication with the impedance bridge through the equal length transmission lines $T_1$ 1906, $T_2$ 1908, $T_3$ 1910, and $T_4$ 1912 with the characteristic impedance $Z_0'$.

Figure 20A:
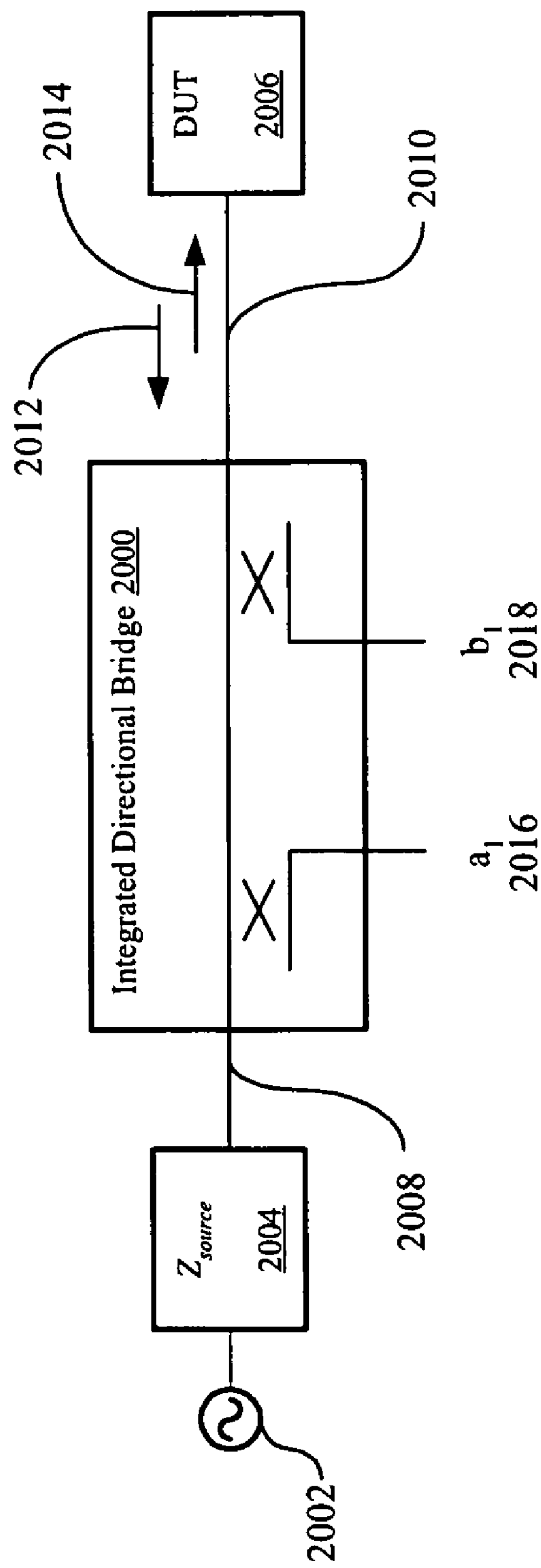
FIG. 20A is a schematic diagram of an example of an implementation of an integrated directional bridge utilized as a reflectometer.

In FIG. 20A, a schematic diagram of an example of an implementation of an integrated directional bridge 2000 utilized as a reflectometer is shown. The integrated directional bridge 2000 may be in signal communication with a signal source 2002 having signal source impedance $Z_{source}$ 2004 and a device under test ("DUT") 2006 having load impedance $Z_{load}$ via signal paths 2008 and 2010, respectively.

In an example of operation, DUT 2006 produces $V_{reflected}$ 2012 by reflecting $V_{incident}$ 2014 and the integrated directional bridge 2000 is configured to produce output signals $a_1$ 2016 and $b_1$ 2018 that are proportional to $V_{incident}$ 2014 and $V_{reflected}$ 2012. Output signals $a_1$ 2016 and $b_1$ 2018 may be utilized to generate the return loss and/or corresponding S-parameter values corresponding to the DUT 2006. In this example, the integrated directional bridge 2000 operates as a one-port reflectometer is capable of measuring $S_{11}$, or 1-port S-parameters. Multiple integrated directional bridges 2000 configured as reflectometers may be connected together in an instrument (such as test equipment) to implement a multi-port network analyzer capable of measuring multi-port S-parameters and/or to extend the reflectometer's frequency range as shown in FIG. 21.

Figure 20B:
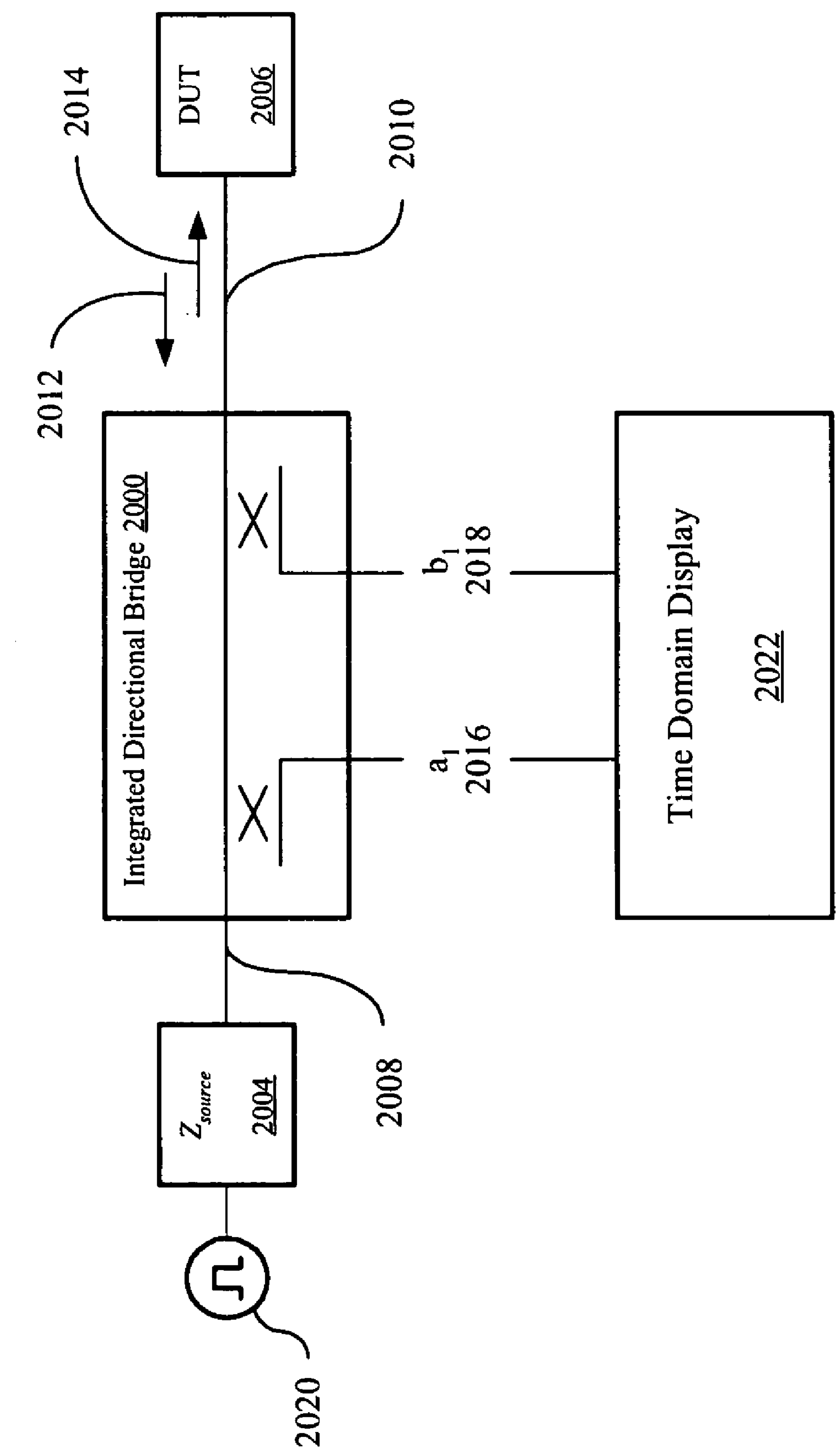
FIG. 20B is a schematic diagram of an example of an implementation of an integrated directional bridge shown in FIG. 20A utilized as a time domain reflectometer.

In FIG. 20B, a schematic of an example of an implementation of an integrated directional bridge 2000 shown in FIG. 20A utilized as a time domain reflectometer is shown. FIG. 20B is similar to FIG. 20A with the exception that the signal source 2002 of FIG. 20A is replaced by a DC pulse signal generator 2020, examples of which be may a time domain pulse or step generator. Also shown is a Time Domain Display 2022 which displays output signals $a_1$ 2016 and $b_1$ 2018, such as a network analyzer, time domain analyzer, or other type of analyzer device.

Figure 21:
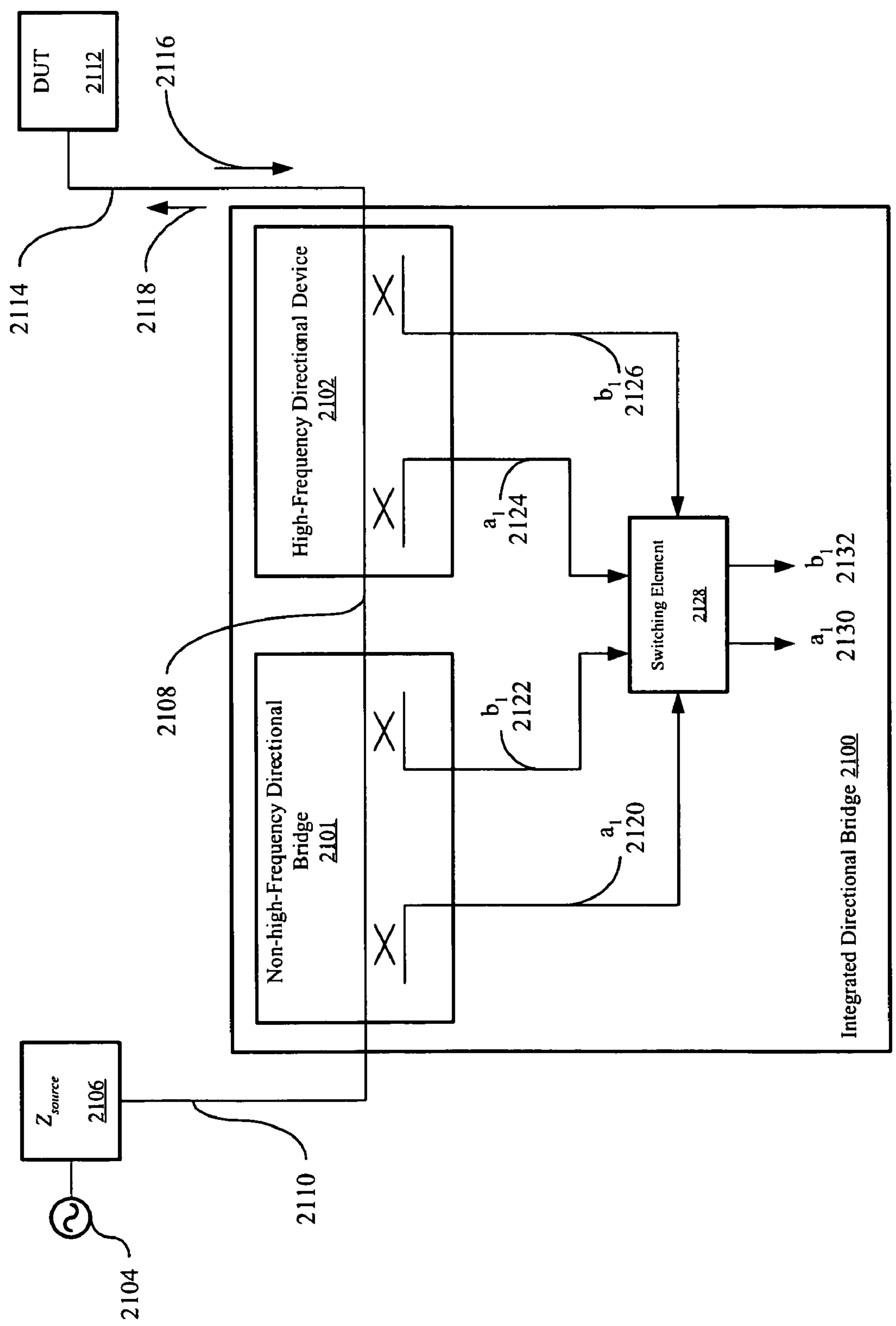
FIG. 21 is a schematic diagram of an example of an implementation of an integrated directional bridge utilized as a reflectometer with extended high frequency operation.

In FIG. 21, a schematic diagram of an example of an implementation of an integrated directional bridge 2100 utilized as a reflectometer with extended high frequency operation is shown. The integrated directional bridge 2100 may include a non-high-frequency directional bridge 2101 and a high-frequency directional bridge or high-frequency directional bridge coupler 2102. The non-high-frequency directional bridge 2101 may be in signal communication with a high-frequency directional bridge 2102 and a signal source 2104 having signal source impedance $Z_{source}$ 2106 via signal paths 2108 and 2110, respectively. Similarly, the high-frequency directional bridge 2102 may be in signal communication with a DUT 2112 having load impedance $Z_{load}$ via signal path 2114.

In an example of operation, DUT 2112 produces $V_{reflected}$ 2116 by reflecting $V_{incident}$ 2118 and the non-high-frequency directional bridge 2101 is configured to produce non-high frequency output signals $a_1$ 2120 and $b_1$ 2122 that are proportional to $V_{incident}$ 2118 and $V_{reflected}$ 2116. The high-frequency directional bridge 2102 is also configured to produce high frequency output signals $a_1$ 2124 and $b_1$ 2126 that are proportional to $V_{incident}$ 2118 and $V_{reflected}$ 2116. The integrated directional bridge 2100 may also include a switching element 2128 that receives the non-high frequency output signals $a_1$ 2120 and $b_1$ 2122 and the high frequency output signals $a_1$ 2124 and $b_1$ 2126 and produces switched output signals $a_1$ 2130 and $b_1$ 2132. The integrated directional bridge 2100 utilizes the switched element 2128 to select the desired output signals depending on the frequency of operation of the integrated directional bridge 2100. This implementation example allows the integrated directional bridge 2100 to operate from DC to high-frequency. An example of a circuit implementation of the integrated directional bridge 2100 is shown in FIG. 22.

Figure 22:
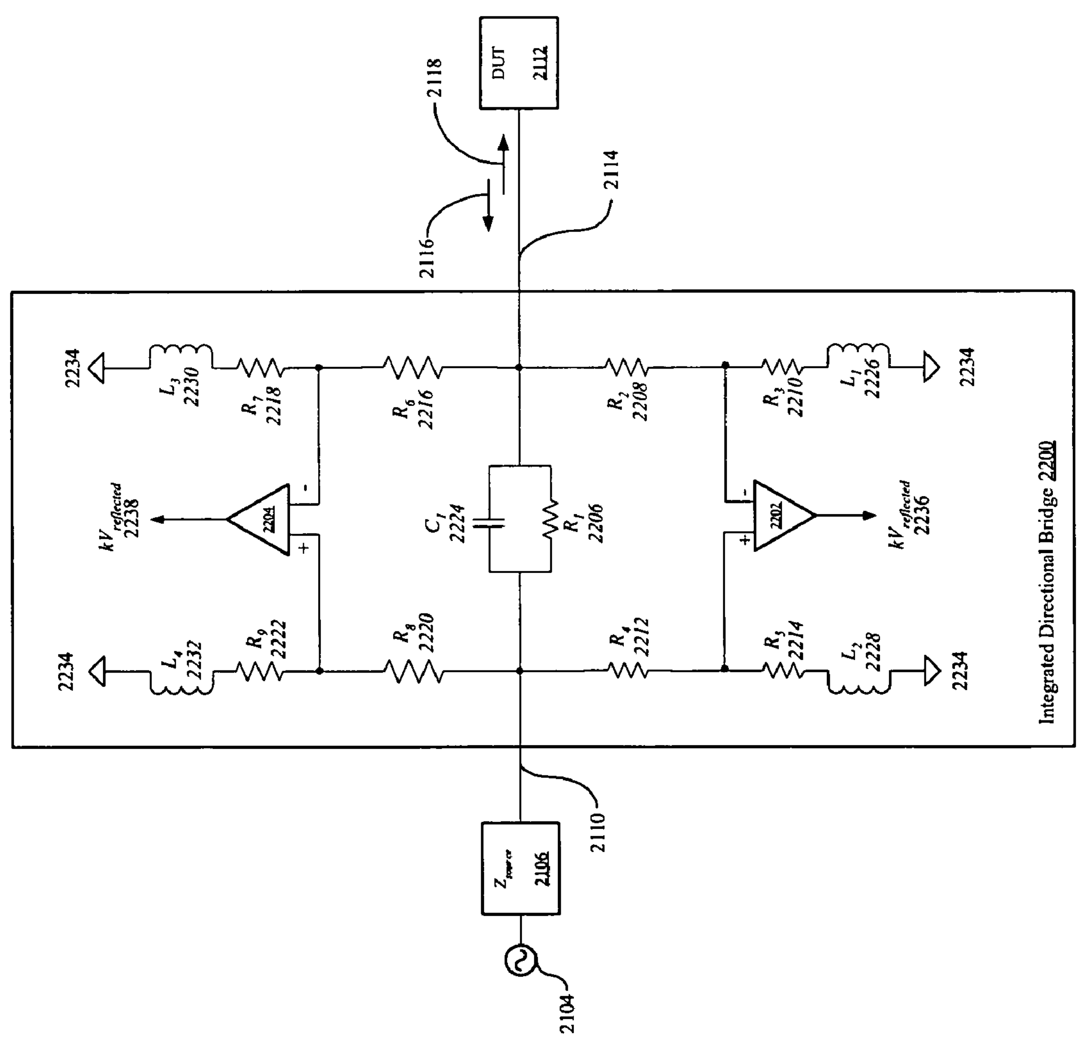
FIG. 22 is a block diagram of an example implementation of an integrated directional bridge having low through loss at high frequencies.

In FIG. 22, a circuit schematic diagram of an example implementation of an integrated directional bridge 2200 of FIG. 21 is shown. The integrated directional bridge 2200 may be configured similar to the implementation examples shown in FIGS. 6 and 7. As an example, the integrated directional bridge 2200 may include differential amplifiers 2202 and 2204 and may be implemented with a plurality of resistors $R_1$ 2206, $R_2$ 2208, $R_3$ 2210, $R_4$ 2212, $R_5$ 2214, $R_6$ 2216, $R_7$ 2218, $R_8$ 2220, and $R_9$ 2222, a capacitive element $C_1$ 2224, and four inductive elements $L_1$ 2226, $L_2$ 2228, $L_3$ 2230, and $L_4$ 2232. This implementation has low through-loss at high frequencies because of the capacitive element $C_1$ 2224 that shunts the series element $R_1$ 2206 and inductive elements $L_1$ 2226, $L_2$ 2228, $L_3$ 2230, and $L_4$ 2232 in series with the shunt elements $R_3$ 2210, $R_5$ 2214, $R_7$ 2218, and $R_9$ 2222, respectively, of the integrated directional bridge 2200. The four inductive elements $L_1$ 2226, $L_2$ 2228, $L_3$ 2230, and $L_4$ 2232 are in signal communication with a common ground 2234.

The resistive values of the resistive elements may be chosen in relation to the impedance values of the implementation example shown in FIG. 6. As an example, $R_1$ 2206 may be equal to the real impedance value of $Z_1$ 622 of FIG. 6, $R_2$ 2208 and $R_8$ 2220 may be equal to twice the real impedance value of $Z_2$ 624 of FIG. 6, $R_4$ 2212 and $R_6$ 2216 may be equal to twice the real impedance value of $Z_4$ 628 of FIG. 6, $R_3$ 2210 and $R_9$ 2222 may be equal to twice the real impedance value of $Z_3$ 626 of FIG. 6, and $R_5$ 2214 and $R_7$ 2218 may be equal to twice the real impedance value of $Z_5$ 630 of FIG. 6.

In an example of operation, DUT 2112 produces $V_{reflected}$ 2116 by reflecting $V_{incident}$ 2118 and the integrated directional bridge 2200 is configured to produce amplified difference signals 2236 and 2238 that are proportional to $V_{incident}$ 2118 and $V_{reflected}$ 2116 where the value of these amplified difference signals 2236 and 2238 may be approximately equal to $kV_{incident}$ and $kV_{reflected}$, where k is equal to the amplifier gain of the differential amplifiers 2202 and 2204.

Figure 23:
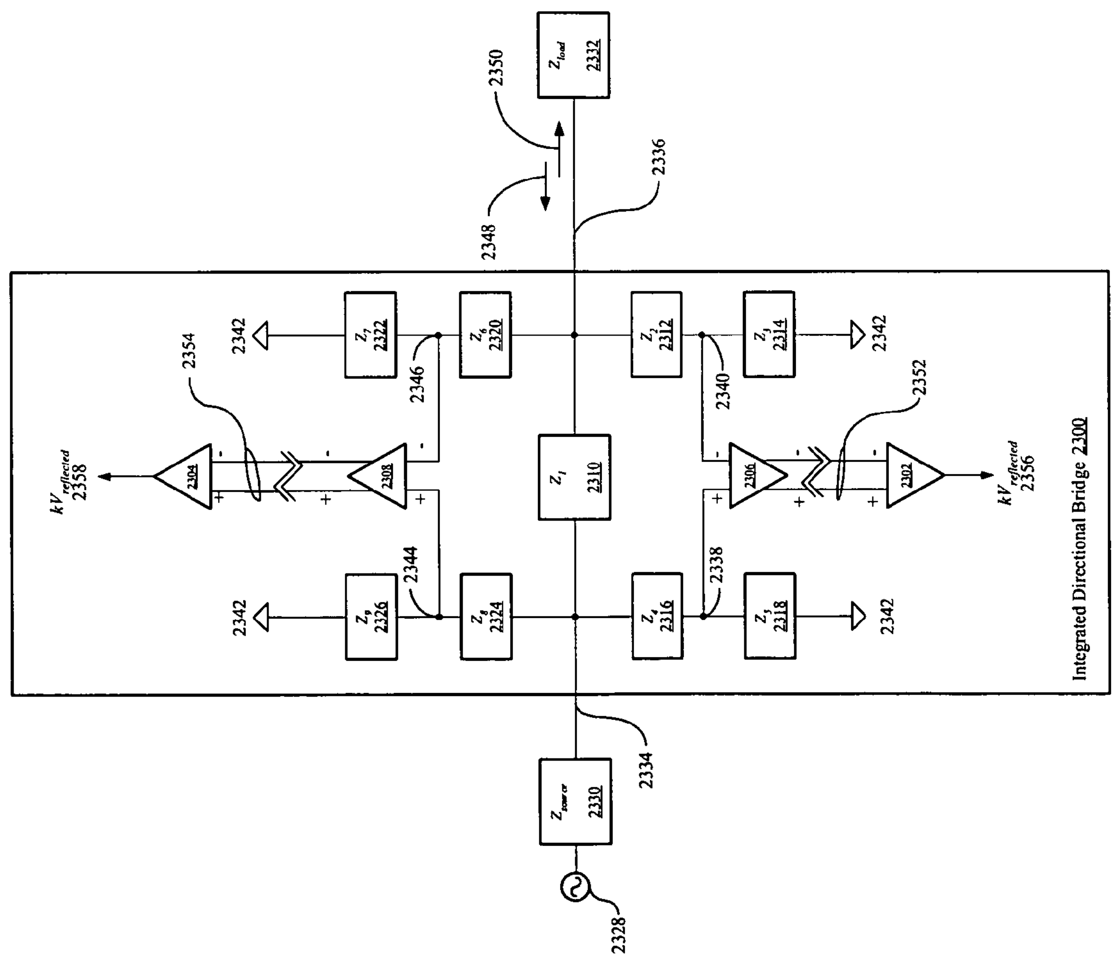
FIG. 23 is a block diagram of an example implementation of an integrated directional bridge having remote sensing elements.

In FIG. 23, a block diagram of an example implementation of an integrated direction bridge 2300 having remote sensing elements 2302 and 2304 is shown. The integrated directional bridge 2300 may be configured similar to the implementation examples shown in FIGS. 6 and 7. As an example, the integrated directional bridge 2300 may include the remote sensing elements 2302 and 2304, amplifiers 2306 and 2308, and may be implemented with impedance elements $Z_1$ 2310, $Z_2$ 2312, $Z_3$ 2314, $Z_4$ 2316, $Z_5$ 2318, $Z_6$ 2320, $Z_7$ 2322, $Z_8$ 2324, and $Z_9$ 2326. The integrated directional bridge 2300 may be in signal communication with a signal source 2328 having a signal source impedance $Z_{source}$ 2330 and a load having a load impedance $Z_{load}$ 2332 via signal paths 2334 and 2336, respectively. In this example, $Z_1$ 2310 is equal in impedance value to $Z_1$ 312 in FIG. 3, $Z_2$ 2312 and $Z_8$ 2324 are equal in impedance value to twice the impedance value of $Z_2$ 314 in FIG. 3, $Z_3$ 2314 and $Z_9$ 2326 are equal in impedance value to twice the impedance value of $Z_3$ 316 in FIG. 3, $Z_4$ 2316 and $Z_6$ 2320 are equal in impedance value to twice the impedance value of $Z_4$ 318 in FIG. 3, and $Z_5$ 2318 and $Z_7$ 2322 are equal in impedance value to twice the impedance value of $Z_5$ 320 in FIG. 3.

$Z_{source}$ 2330 is in signal communication with impedance elements $Z_1$ 2310, $Z_4$ 2316, and $Z_8$ 2324. $Z_{load}$ 2332 is in signal communication with impedance elements $Z_1$ 2310, $Z_2$ 2312, and $Z_6$ 2320. The amplifier 2306 is in signal communication with both $Z_4$ 2316 and $Z_5$ 2318 at node 2338. The amplifier 2306 is also in signal communication with both $Z_2$ 2312 and $Z_3$ 2314 at node 2340. Both $Z_5$ 2318 and $Z_3$ 2314 are in signal communication with a common ground 2342. Similarly, the amplifier 2308 is in signal communication with both $Z_8$ 2324 and $Z_9$ 2326 at node 2344. The amplifier 2308 is also in signal communication with both $Z_6$ 2320 and $Z_7$ 2322 at node 2346. Both $Z_7$ 2322 and $Z_9$ 2326 are in signal communication with a common ground 2342.

As an example of operation, it is appreciated that $Z_{load}$ 2332 produces $V_{reflected}$ 2348 by reflecting $V_{incident}$ 2350 and the integrated directional bridge 2300 is configured to produce amplified signals 2352 and 2354, respectively, which are passed to remote sensing elements 2302 and 2304. The remote sensing elements 2302 and 2304 may be differential amplifiers configured to produce amplified difference signals 2356 and 2358, respectively, that are proportional to $V_{incident}$ 2350 and $V_{reflected}$ 2348 and the value of these amplified difference signals 2356 and 2358 may be approximately equal to $kV_{incident}$ and $kV_{reflected}$, where k is equal to the amplifier gain of the differential amplifiers 2302 and 2304 multiplied by the coupling factor of the directional bridge.

Figure 24:
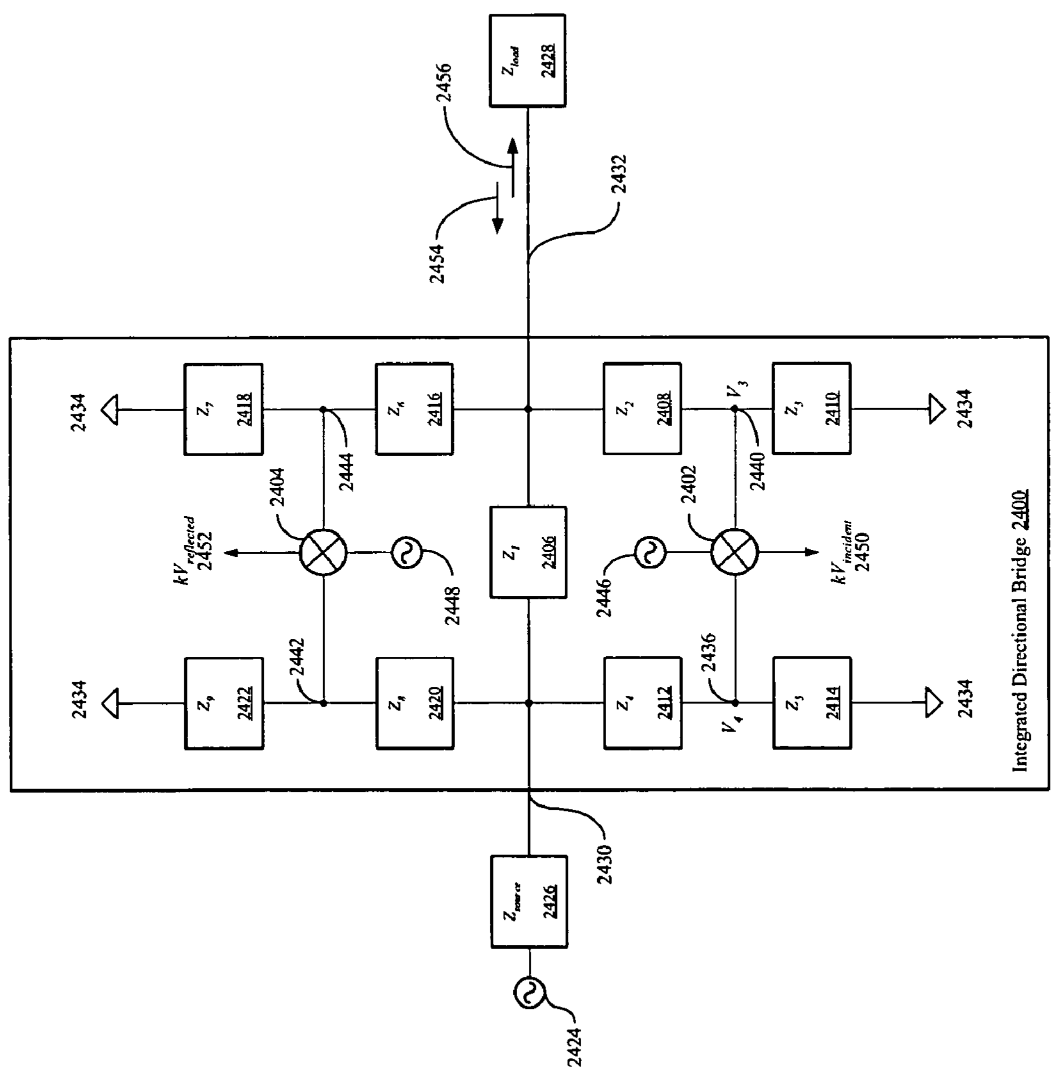
FIG. 24 is a block diagram of an example implementation of an integrated directional bridge utilizing balanced mixers as the sensing elements.

In FIG. 24, a block diagram of an example implementation of an integrated directional bridge 2400 utilizing balanced mixers 2402 and 2404 as the sensing elements is shown. The mixers 2402 and 2404 may be mixers with balanced RF input on chip such as, for example, Gilbert Cell mixers. In this implementation example, the mixers 2402 and 2404 are the sensing elements instead of differential amplifiers. The mixers 2402 and 2404 may be directly connected to the integrated directional bridge 2400 or they may be driven by a differential amplifier (not shown) that has a differential output.

The integrated directional bridge 2400 may be configured similar to the implementation examples shown in FIGS. 6 and 7. As an example, the integrated directional bridge 2400 may include the mixers 2402, and 2404, and may be implemented with impedance elements $Z_1$ 2406, $Z_2$ 2408, $Z_3$ 2410, $Z_4$ 2412, $Z_5$ 2414, $Z_6$ 2416, $Z_7$ 2418, $Z_8$ 2420, and $Z_9$ 2422. The integrated directional bridge 2400 may be in signal communication with a signal source 2424 having a signal source impedance $Z_{source}$ 2426 and a load having a load impedance $Z_{load}$ 2428 via signal paths 2430 and 2432, respectively. In this example, $Z_1$ 2406 is equal in impedance value to $Z_1$ 312 in FIG. 3, $Z_2$ 2408 and $Z_8$ 2420 are equal in impedance value to twice the impedance value of $Z_2$ 314 in FIG. 3, $Z_3$ 2410 and $Z_9$ 2422 are equal in impedance value to twice the impedance value of $Z_3$ 316 in FIG. 3, $Z_4$ 2412 and $Z_6$ 2416 are equal in impedance value to twice the impedance value of $Z_4$ 318 in FIG. 3, and $Z_5$ 2414 and $Z_7$ 2418 are equal in impedance value to twice the impedance value of $Z_5$ 320 in FIG. 3. $Z_3$ 2410, $Z_5$ 2414, $Z_7$ 2418, and $Z_9$ 2422 are in signal communication with common ground 2434.

$Z_{source}$ 2426 is in signal communication with impedance elements $Z_1$ 2406, $Z_4$ 2412, and $Z_8$ 2420. $Z_{load}$ 2428 is in signal communication with impedance elements $Z_1$ 2406, $Z_2$ 2408, and $Z_6$ 2416. The first mixer 2402 is in signal communication with both $Z_4$ 2412 and $Z_5$ 2414 at node 2436. The first mixer 2402 is also in signal communication with both $Z_2$ 2408 and $Z_3$ 2410 at node 2440. Similarly, the second mixer 2404 is in signal communication with both $Z_8$ 2420 and $Z_9$ 2422 at node 2442. The second mixer 2404 is also in signal communication with both $Z_6$ 2416 and $Z_7$ 2418 at node 2444. The first mixer 2402 and second mixer 2404 may also be driven by frequency sources 2446 and 2448 and produce output difference signals 2450 and 2452, respectively.

As an example of operation, passive load $Z_{load}$ 2428 produces $V_{reflected}$ 2454 by reflecting $V_{incident}$ 2456 (but $V_{reflected}$ 2454 may be generated by $Z_{load}$ if $Z_{load}$ is an active device) and the integrated directional bridge 2400 is configured to produce amplified difference signals 2450 and 2452 that are proportional to $V_{incident}$ 2456 and $V_{reflected}$ 2454 and the value of these amplified difference signals 2450 and 2452 may be approximately equal to $kV_{incident}$ and $kV_{reflected}$ where k is equal to the proportional factor produced by the gain of mixers 2402 and 2404 multiplied by the coupling factor of the directional bridge.

While the foregoing description refers to the use of an Integrated Directional Bridge, the subject matter is not limited to such a system. Any directional bridge system that could benefit from the functionality provided by the components described above may be implemented in the Integrated Directional Bridge.

Moreover, it will be understood that the foregoing description of numerous implementations has been presented for purposes of illustration and description. It is not exhaustive and does not limit the claimed inventions to the precise forms disclosed. Modifications and variations are possible in light of the above description or may be acquired from practicing the invention. The claims and their equivalents define the scope of the invention.

What is claimed:

1. A directional bridge for measuring propagated signals to and from a source device from and to, respectively, a load device where both the source device and the load device are in signal communication with the directional bridge, the directional bridge comprising:

a first bridge circuit; and a first sensing element in signal communication with the first bridge circuit, wherein the first sensing element produces a first measured signal that is proportional to the propagated signals, wherein the first bridge circuit includes a first impedance element in signal communication with the source at a first node and the first sensing element at a second node, a second impedance element in signal communication with the source and first impedance element at the first node and in signal communication with the first sensing element at a third node, and a third impedance element in signal communication with the second impedance element and the first sensing element at the third node, and wherein the first measured signal is produced by the first sensing element in response to detecting a difference in voltage between a first voltage at the third node and a second voltage at the second node, wherein the first measured signal is proportional to the propagated signal from the source to the load or to the propagated signal from the load to the source, and wherein the first sensing element is selected from the group consisting of passive transformer, diode, power sensing device, balun, differential amplifier, mixer, and sampler.

2. The directional bridge of claim 1, further including:

a second bridge circuit; and a second sensing element in signal communication with the second bridge circuit, wherein the second sensing element produces a second measured signal that is proportional to the propagated signals, wherein the second bridge circuit includes a fourth impedance element in signal communication with the source, the first impedance element, and the second impedance element at the first node and in signal communication with the second sensing element at a fourth node, and a fifth impedance element in signal communication with both the fourth impedance element and the second sensing element at the fourth node, and wherein the second measured signal is produced by the second sensing element in response to detecting a difference in voltage between a third voltage at the fourth node and a second voltage at the second node, wherein the second measured signal is proportional to the propagated signal from the source to the load or to the propagated signal from the load to the source, and wherein the second sensing element is selected from the group consisting of passive transformer, diode, power sensing device, balun, differential amplifier, mixer, and sampler.

3. The directional bridge of claim 2, wherein the mixer is a Gilbert Cell mixer.

4. The directional bridge of claim 2, wherein both the third impedance element and the fifth impedance element are in signal communication with a common ground.

5. The directional bridge of claim 2, wherein the first impedance element, the first sensing element, and second sensing element are in signal communication with the load at the second node.

6. The directional bridge of claim 2, wherein the first impedance element includes a first parallel impedance element and a second parallel impedance element, wherein the first parallel impedance element is electrically connected in parallel to the second parallel impedance element, and wherein the first parallel impedance element is included in the first bridge circuit and the second parallel impedance element is included in the second bridge circuit.

7. The directional bridge of claim 1, further including: a fourth impedance element in signal communication with both the first impedance element and the first sensing element at the second node and in signal communication with the load at a fourth node;

a fifth impedance element in signal communication with both the fourth impedance element and the load at the fourth node;

a sixth impedance element in signal communication with the fifth impedance element at a fifth node; and a second sensing element in signal communication with the first sensing element, first impedance element, and fourth impedance element at the second node and in signal communication with both the fifth impedance element and sixth impedance element at the fifth node, wherein the second sensing element produces a second measured signal that is proportional to the propagated signals, wherein the second measured signal is produced by the second sensing element in response to detecting a difference in voltage between the second voltage at the second node and a third voltage at the fifth node, wherein the second measured signal is proportional to the propagated signal from the source to the load or to the propagated signal from the load to the source, and wherein the second sensing element is selected from the group consisting of passive transformer, diode, power sensing device, balun, differential amplifier, mixer, and sampler.

8. The directional bridge of claim 7, wherein the mixer is a Gilbert Cell mixer.

9. The directional bridge of claim 7, wherein both the third impedance element and the sixth impedance element are in signal communication with a common ground.

10. A directional bridge for measuring propagated signals to and from a source device from and to, respectively, a load device where both the source device and the load device are in signal communication with the directional bridge, the directional bridge comprising:

a first bridge circuit;

a first sensing element in signal communication with the first bridge circuit, wherein the first sensing element produces a first measured signal that is proportional to the propagated signals, wherein the first bridge circuit includes a first impedance element in signal communication with both the source and the first sensing element at a first node, a second impedance element in signal communication with the first impedance element at a second node and in signal communication with the first sensing element at a third node, and a third impedance element in signal communication with both the second impedance element and the first sensing element at the third node, wherein the first measured signal is produced by the first sensing element in response to detecting a difference in voltage between a first voltage at the first node and a second voltage at the third node, wherein the first measured signal is proportional to the propagated signal from the source to the load or to the propagated signal from the load to the source, and wherein the first sensing element is selected from the group consisting of passive transformer, detector diode, power sensing device, balun, differential amplifier, mixer and sampler;

a second bridge circuit; and a second sensing element in signal communication with the second bridge circuit and both first impedance element and first sensing element at the first node, wherein the second sensing element produces a second measured signal that is proportional to the propagated signals, wherein the second bridge circuit includes a fourth impedance element in signal communication with both the first impedance element and the second impedance element at the second node and in signal communication with the second sensing element at a fourth node, and a fifth impedance element in signal communication with both the fourth impedance element and the second sensing element at the fourth node, and wherein the second measured signal is produced by the second sensing element in response to detecting a difference in voltage between the first voltage at the first node and a third voltage at the fourth node, wherein the second measured signal is proportional to the propagated signal from the source to the load or to the propagated signal from the load to the source, and wherein the second sensing element is selected from the group consisting of passive transformer, detector diode, power sensing device, balun, differential amplifier, mixer, and sampler.

11. The directional bridge of claim 10, wherein the mixer is a Gilbert Cell mixer.

12. The directional bridge of claim 10, wherein both the third impedance element and the fifth impedance element are in signal communication with a common ground.

13. The directional bridge of claim 10, wherein the first impedance element, the second impedance element, and fourth impedance element are in signal communication with the load at the second node.

14. The directional bridge of claim 10, wherein the first impedance element includes a first parallel impedance element and a second parallel impedance element, wherein the first parallel impedance element is electrically connected in parallel to the second parallel impedance element, and wherein the first parallel impedance element is included in the first bridge circuit and the second parallel impedance element is included in the second bridge circuit.

15. A directional bridge for measuring propagated signals to and from a source device from and to, respectively, a load device where both the source device and the load device are in signal communication with the directional bridge, the directional bridge comprising:

a first bridge circuit;

a first sensing element in signal communication with the first bridge circuit, wherein the first sensing element produces a first measured signal that is proportional to the propagated signals, wherein the first bridge circuit includes a first impedance element in signal communication with both the source and the first sensing element at a first node, a second impedance element in signal communication with the first impedance element at a second node and in signal communication with the first sensing element at a third node, and a third impedance element in signal communication with both the second impedance element and the first sensing element at the third node, wherein the first measured signal is produced by the first sensing element in response to detecting a difference in voltage between a first voltage at the first node and a second voltage at the third node, wherein the first measured signal is proportional to the propagated signal from the source to the load or to the propagated signal from the load to the source, and wherein the first sensing element is selected from the group consisting of passive transformer, detector diode, power sensing device, balun, differential amplifier, mixer and sampler;

a second bridge circuit; and a second sensing element in signal communication with the second bridge circuit and both first impedance element and second impedance element at the second node, wherein the second sensing element produces a second measured signal that is proportional to the propagated signals, wherein the second bridge circuit includes a fourth impedance element in signal communication with both the first impedance element and the first sensing element at the first node and in signal communication with the second sensing element at a fourth node, and a fifth impedance element in signal communication with both the fourth impedance element and the second sensing element at the fourth node, and wherein the second measured signal is produced by the second sensing element in response to detecting a difference in voltage between a third voltage at the fourth node and a fourth voltage at the second node, wherein the second measured signal is proportional to the propagated signal from the source to the load or to the propagated signal from the load to the source, and wherein the second sensing element is selected from the group consisting of passive transformer, diode, power sensing device, balun, differential amplifier, mixer, and sampler.

16. The directional bridge of claim 15, wherein both the third impedance element and the fifth impedance element are in signal communication with a common ground.

17. The directional bridge of claim 15, wherein the first impedance element, the second impedance element, and the second sensing element are in signal communication with the load at the second node, and wherein the first impedance element includes a first parallel impedance element and a second parallel impedance element, wherein the first parallel impedance element is electrically connected in parallel to the second parallel impedance element, and wherein the first parallel impedance element is included in the first bridge circuit and the second parallel impedance element is included in the second bridge circuit.

18. A directional bridge for measuring propagated signals to and from a source device from and to, respectively, a load device where both the source device and the load device are in signal communication with the directional bridge, the directional bridge comprising:

a first bridge circuit;

a first sensing element in signal communication with the first bridge circuit, wherein the first sensing element produces a first measured signal that is proportional to the propagated signals, wherein the first bridge circuit includes a first impedance element in signal communication with both the source and the first sensing element at a first node, a second impedance element in signal communication with the first impedance element at a second node and in signal communication with the first sensing element at a third node, and a third impedance element in signal communication with both the second impedance element and the first sensing element at the third node, wherein the first measured signal is produced by the first sensing element in response to detecting a difference in voltage between a first voltage at the first node and a second voltage at the third node, wherein the first measured signal is proportional to the propagated signal from the source to the load or to the propagated signal from the load to the source, and wherein the first sensing element is selected from the group consisting of passive transformer, detector diode, power sensing device, balun, differential amplifier, mixer and sampler;

a fourth impedance element in signal communication with both the first impedance element and the second impedance element at the second node and in signal communication at a fourth node; and a second sensing element in signal communication with the first sensing element, second impedance element, and third impedance element at the third node and in signal communication with the fourth impedance element at the fourth node, wherein the second sensing element produces a second measured signal that is proportional to the propagated signals, wherein the second measured signal is produced by the second sensing element in response to detecting a difference in voltage between the second voltage at the third node and a third voltage at the fourth node, wherein the second measured signal is proportional to the propagated signal from the source to the load or to the propagated signal from the load to the source, and wherein the second sensing element is selected from the group consisting of passive transformer, diode, power sensing device, bahin, differential amplifier, mixer, and sampler.

19. The directional bridge of claim 18, wherein the mixer is a Gilbert Cell mixer.

20. The directional bridge of claim 18, wherein the third impedance element is in signal communication with a common ground, and wherein the fourth impedance element and second sensing element are in signal communication with the load at the second node.

21. A directional bridge for measuring propagated signals to and from a source device from and to, respectively, a load device where both the source device and the load device are in signal communication with the directional bridge, the directional bridge comprising:

a first bridge circuit; and a first sensing element in signal communication with the first bridge circuit, wherein the first sensing element produces a first measured signal that is proportional to the propagated signals, wherein the first bridge circuit includes a first impedance element in signal communication with the source at a first node, a second impedance element in signal communication with the source and first impedance element at the first node and in signal communication with the first sensing element at a second node, a third impedance element in signal communication with the second impedance element and the first sensing element at the second node, a fourth impedance element in signal communication with the first impedance element at a third node and with the first sensing element at a fourth node, and a fifth impedance element in signal communication with the fourth impedance element and the first sensing element at the fourth node, and wherein the first measured signal is produced by the first sensing element in response to detecting a difference in voltage between a first voltage at the second node and a second voltage at the fourth node, wherein the first measured signal is proportional to the propagated signal from the source device to the load device or to the propagated signal from the load device to the source device, and wherein the first sensing element is selected from the group consisting of passive transformer, diode, power sensing device, balun, differential amplifier, mixer, and sampler.

22. The directional bridge of claim 21, wherein the mixer is a Gilbert Cell mixer.

23. The directional bridge of claim 22, wherein the third impedance element and fifth impedance element are in signal communication with a common ground, wherein both the first impedance element and fourth impedance element are in signal communication with the load at the third node.

24. The directional bridge of claim 21, further including:

a second bridge circuit; and a second sensing element in signal communication with the second bridge circuit, wherein the second sensing element produces a second measured signal that is proportional to the propagated signals, wherein the second bridge circuit includes a sixth impedance element in signal communication with both the first impedance element and the second impedance element at the first node and in signal communication with the second sensing element at a fifth node, a seventh impedance element in signal communication with both the sixth impedance element and the second sensing element at the fifth node, an eighth impedance element in signal communication with both the first impedance element and the fourth impedance element at the third node and in signal communication with the second sensing element at a sixth node, and a ninth impedance element in signal communication with the eighth impedance element at the sixth node, and wherein the second measured signal is produced by the second sensing element in response to detecting a difference in voltage between a third voltage at the fifth node and a fourth voltage at the sixth node, wherein the second measured signal is proportional to the propagated signal from the source to the load or to the propagated signal from the load to the source, and wherein the second sensing element is selected from the group consisting of passive transformer, diode, power sensing device, balun, differential amplifier, mixer, and sampler.

25. The directional bridge of claim 24, wherein the mixer is a Gilbert Cell mixer.

26. The directional bridge of claim 24, wherein the third impedance element, fifth impedance element, seventh impedance element, and ninth impedance element are in signal communication with a common ground.

27. The directional bridge of claim 24, wherein both the first impedance element, fourth impedance element, and eighth impedance element are in signal communication with the load at the third node.

28. The directional bridge of claim 24, wherein: the second impedance element includes a first plurality of impedance elements connected in series; the fourth impedance element includes a second plurality of impedance elements connected in series; the sixth impedance element includes a third plurality of impedance elements connected in series; and the eighth impedance element includes a fourth plurality of impedance elements connected in series.

29. The directional bridge of claim 28, wherein: the second impedance element includes a first transmission line in signal communication with the second node; the fourth impedance element includes a second transmission line in signal communication with the fourth node; the sixth impedance element includes a third transmission line in signal communication with the fifth node; and the eighth impedance element includes a fourth transmission line in signal communication with the eighth node.

30. The directional bridge of claim 24, further including: a first amplifier in signal communication with both the second impedance element and third impedance element at the second node and in signal communication with both the fourth impedance element and fifth impedance element at the fourth node; a second amplifier in signal communication with both the sixth impedance element and seventh impedance element at the fifth node and in signal communication with both the eighth impedance element and ninth impedance element at the sixth node; a first transmission line in signal communication with the first amplifier and the first sensing element, wherein the first amplifier and first transmission line transmit the first voltage and second voltage to the first sensing element; and a second transmission line in signal communication with the second amplifier and the second sensing element, wherein the second amplifier and second transmission line transmit the third voltage and fourth voltage to the second sensing element.

31. The directional bridge of claim 30, wherein the third impedance element, fifth impedance element, seventh impedance element, and ninth impedance element are in signal communication with a common ground, and wherein both the first impedance element, fourth impedance element, and eighth impedance element are in signal communication with the load at the third node.

32. The directional bridge of claim 21, further including:

a sixth impedance element in signal communication with both the first impedance element and the fourth impedance element at the third node;

a seventh impedance element in signal communication with the sixth impedance element at a fifth node;

a eighth impedance element in signal communication with the seventh impedance element at a sixth node; and a second sensing element in signal communication with the first sensing element, fourth impedance element, and fifth impedance element at the fourth node and in signal communication with both the seventh impedance element and eighth impedance element at the sixth node, wherein the second sensing element produces a second measured signal that is proportional to the propagated signals, wherein the second measured signal is produced by the second sensing element in response to detecting a difference in voltage between the second voltage at the fourth node and a third voltage at the sixth node, wherein the second measured signal is proportional to the propagated signal from the source to the load or to the propagated signal from the load to the source. And wherein the second sensing element is selected from the group consisting of passive transformer, diode, power sensing device, balun, differential amplifier, mixer, and sampler.

33. The directional bridge of claim 32, wherein the mixer is a Gilbert Cell mixer.

34. The directional bridge of claim 32, wherein the third impedance element, fifth impedance element, and eighth impedance element are in signal communication with a common ground, and wherein both the sixth impedance element and seventh impedance element are in signal communication with the load at the third node.

35. A balanced directional bridge comprising first and second directional bridges as recied in claim 32, wherein the first directional bridge is connected in series between a first source and a first load and the second directional bridge is connected in series between a second source and a second load, the first and second sources sharing a common ground and the first and second loads sharing a common ground, wherein outputs from the bridge's first sensing element and the second bridge's first sensing element are in signal communication with a fifth sensing element, and outputs from the first bridge's second sensing element and the second bridge's second sensing element are in signal communication with a sixth sensing element, wherein the fifth and sixth sensing elements respectively produce fifth and sixth measured signals that are proportional to the propagated signals.

* * * * *